(12) United States Patent
Li et al.

(10) Patent No.: US 12,020,624 B2
(45) Date of Patent: *Jun. 25, 2024

(54) DISPLAY SUBSTRATE AND DISPLAY DEVICE

(71) Applicant: BOE Technology Group Co., Ltd., Beijing (CN)

(72) Inventors: Zhenzhen Li, Beijing (CN); Kuo Sun, Beijing (CN); Lujiang Huangfu, Beijing (CN); Shanshan Bai, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/731,672

(22) Filed: Apr. 28, 2022

(65) Prior Publication Data

US 2022/0254296 A1 Aug. 11, 2022

Related U.S. Application Data

(63) Continuation of application No. 16/615,996, filed as application No. PCT/CN2019/078871 on Mar. 20, 2019, now Pat. No. 11,538,392.

(30) Foreign Application Priority Data

Jun. 20, 2018 (CN) .......................... 201810639832.6

(51) Int. Cl.
*G09G 3/20* (2006.01)
*G07F 17/32* (2006.01)
*G07F 17/34* (2006.01)

(52) U.S. Cl.
CPC ....... *G09G 3/2074* (2013.01); *G07F 17/3213* (2013.01); *G07F 17/3218* (2013.01);
(Continued)

(58) Field of Classification Search
CPC ......... G09G 3/2074; G09G 2300/0452; G09G 2320/0233; G09G 2340/0407; G09G 3/20;
(Continued)

(56) References Cited

U.S. PATENT DOCUMENTS 10,338,680 B2   8/2019  Zheng et al.
10,373,456 B2   8/2019  Henson et al.
(Continued)

FOREIGN PATENT DOCUMENTS

CN    103745688 A    4/2014
CN    103886809 A    6/2014
(Continued)

OTHER PUBLICATIONS

Office Action for corresponding U.S. Appl. No. 16/644,791.
(Continued)

*Primary Examiner* — Ricardo Osorio
(74) *Attorney, Agent, or Firm* — ArentFox Schiff LLP; Michael Fainberg

(57) ABSTRACT

A display substrate, a method for driving the same, a display device, and a fine metal mask are provided, and a display area of the display substrate includes a first display sub-area in which pixels are distributed at a high density, and a second display sub-area in which pixels are distributed at a low density.

19 Claims, 20 Drawing Sheets

(52) U.S. Cl.
CPC ...... *G07F 17/3225* (2013.01); *G07F 17/3244* (2013.01); *G07F 17/3267* (2013.01); *G07F 17/34* (2013.01); *G09G 2300/0452* (2013.01); *G09G 2320/0233* (2013.01)

(58) Field of Classification Search
CPC ............. G07F 17/3213; G07F 17/3218; G07F 17/3225; G07F 17/3244; G07F 17/3267; G07F 17/34; H01L 27/326; H01L 27/32; H01L 27/3267
See application file for complete search history.

(56) References Cited

U.S. PATENT DOCUMENTS

| | | | |
|---|---|---|---|
| 10,586,511 | B2 | 3/2020 | Yang et al. |
| 10,606,541 | B2 | 3/2020 | Yanagisawa et al. |
| 2004/0227703 | A1 | 11/2004 | Lamvik et al. |
| 2006/0033422 | A1 | 2/2006 | Chao et al. |
| 2006/0152531 | A1 | 7/2006 | Lin |
| 2007/0262916 | A1 | 11/2007 | Kee et al. |
| 2008/0088650 | A1 | 4/2008 | Chen et al. |
| 2008/0211757 | A1 | 9/2008 | Weng et al. |
| 2009/0267868 | A1 | 10/2009 | Takatani et al. |
| 2010/0039011 | A1 | 2/2010 | Karaki et al. |
| 2010/0066655 | A1 | 3/2010 | Uh et al. |
| 2012/0092397 | A1 | 4/2012 | Deluca |
| 2014/0361262 | A1 | 12/2014 | Kim |
| 2015/0029208 | A1 | 1/2015 | Kim |
| 2015/0091953 | A1 | 4/2015 | Wu |
| 2015/0364526 | A1 | 12/2015 | Peng et al. |
| 2015/0371612 | A1 | 12/2015 | DeLuca |
| 2016/0027359 | A1 | 1/2016 | Guo et al. |
| 2016/0078807 | A1 | 3/2016 | Sun et al. |
| 2016/0120005 | A1 | 4/2016 | Wu et al. |
| 2016/0155391 | A1 | 6/2016 | Takesue et al. |
| 2016/0203748 | A1 | 7/2016 | Matsueda et al. |
| 2016/0217593 | A1 | 7/2016 | Huang |
| 2016/0253943 | A1 | 9/2016 | Wang |
| 2016/0267847 | A1 | 9/2016 | Chen et al. |
| 2017/0076654 | A1 | 3/2017 | Wang |
| 2017/0097535 | A1 | 4/2017 | Andou et al. |
| 2017/0200428 | A1 | 7/2017 | Song et al. |
| 2017/0345402 | A1 | 11/2017 | Zhou et al. |
| 2018/0012566 | A1 | 1/2018 | Lin et al. |
| 2018/0026218 | A1 | 1/2018 | Kobayashi et al. |
| 2018/0040676 | A1 | 2/2018 | Hack et al. |
| 2018/0088260 | A1 | 3/2018 | Jin et al. |
| 2018/0165533 | A1 | 6/2018 | Cho et al. |
| 2018/0190741 | A1 | 7/2018 | Lou |
| 2018/0350312 | A1 | 12/2018 | Cao et al. |
| 2018/0374426 | A1 | 12/2018 | Chen et al. |
| 2019/0057644 | A1 | 2/2019 | Yan |
| 2019/0130822 | A1 | 5/2019 | Jung et al. |
| 2019/0212788 | A1 | 7/2019 | Kwak et al. |
| 2019/0251895 | A1 | 8/2019 | Zhang et al. |
| 2019/0310724 | A1 | 10/2019 | Yeke Yazdandoost et al. |
| 2019/0326366 | A1 | 10/2019 | Fan et al. |
| 2019/0373166 | A1 | 12/2019 | Jia |
| 2020/0034100 | A1 | 1/2020 | Fan et al. |
| 2020/0043994 | A1 | 2/2020 | Chen et al. |
| 2020/0052059 | A1 | 2/2020 | Chen et al. |
| 2020/0066809 | A1 | 2/2020 | Liu |
| 2020/0175905 | A1 | 6/2020 | Yamazaki et al. |
| 2021/0013277 | A1 | 1/2021 | Liu et al. |
| 2021/0358379 | A1 | 11/2021 | Li et al. |
| 2021/0359053 | A1 | 11/2021 | Shan et al. |

FOREIGN PATENT DOCUMENTS

| | | | |
|---|---|---|---|
| CN | 104157246 | A | 11/2014 |
| CN | 104241295 | A | 12/2014 |
| CN | 104615395 | A | 5/2015 |
| CN | 104658499 | A | 5/2015 |
| CN | 104795016 | A | 7/2015 |
| CN | 205355055 | U | 6/2016 |
| CN | 205845956 | U | 12/2016 |
| CN | 106324875 | A | 1/2017 |
| CN | 106530994 | A | 3/2017 |
| CN | 206194742 | U | 5/2017 |
| CN | 106921767 | A | 7/2017 |
| CN | 106935615 | A | 7/2017 |
| CN | 107422517 | A | 12/2017 |
| CN | 107610635 | A | 1/2018 |
| CN | 107633802 | A | 1/2018 |
| CN | 107808627 | A | 3/2018 |
| CN | 107819018 | A | 3/2018 |
| CN | 107819020 | A | 3/2018 |
| CN | 107844247 | A | 3/2018 |
| CN | 107920142 | A | 4/2018 |
| CN | 107945767 | A | 4/2018 |
| CN | 107948354 | A | 4/2018 |
| CN | 207264695 | U | 4/2018 |
| CN | 207338380 | U | 5/2018 |
| CN | 208507679 | U | 2/2019 |
| EP | 2843466 | A1 | 3/2015 |
| JP | 2009169070 | A | 7/2009 |
| JP | 2010230797 | A | 10/2010 |
| JP | 2011048962 | A | 3/2011 |
| JP | 2016195782 | A | 11/2016 |
| JP | 2017037274 | A | 2/2017 |
| JP | 2017058671 | A | 3/2017 |
| JP | 2017072668 | A | 4/2017 |
| JP | 2017533475 | A | 11/2017 |
| KR | 1020070067962 | A | 6/2007 |
| KR | 1020150107883 | A | 9/2015 |
| KR | 20170024182 | A | 3/2017 |
| KR | 20170113066 | A | 10/2017 |
| KR | 1020180067196 | A | 6/2018 |
| WO | 2014114178 | A1 | 7/2014 |

OTHER PUBLICATIONS

ESSR for 19822745.6 Dated Jan. 26, 2022.
ESSR for 19826064.8 Dated Jan. 25, 2022.
Korean Office Action for 1020207017998 issued on Mar. 28, 2022.
Korean Office Action for 1020207018044 issued on Mar. 28, 2022.
Non FInal Office Action for corresponding U.S. Appl. No. 16/615,971.
Notice of Allowance for corresponding U.S. Appl. No. 16/615,971.
Non Final Office Action for corresponding U.S. Appl. No. 16/615,996.
Notice of Allowance for corresponding U.S. Appl. No. 16/644,791.
Office Action for corresponding Chinese Application No. 201810638716.2 issued on May 7, 2020.
Korean Office Action for corresponding Application No. 9-5-2021-048085262 issued on Aug. 17, 2021.
ESSR for corresponding Application No. 19821969.3 isued on Feb. 10, 2022.
Indian Office Action for corresponding Application No. 201947051749 issued on Dec. 3, 2021.
Non Final Office Action in U.S. Appl. No. 16/615,996 dated Dec. 9, 2021.
Non Final Office Action in U.S. Appl. No. 16/615,552 dated Sep. 22, 2021.
Office Action for corresponding Chinese Application No. 201810639832.6 issued on Jul. 5, 2021.
Wang et al. "Parameters Analysis of Single Pixel of Active Matrix Array for Amorphous Silicon Thin Film Transistor Organic LED" Semiconductor Optoelectronics, vol. 28, No. 2, Apr. 30, 2007.
Office Action for corresponding Korean Application No. 10-2020-7018044.
Office Action for corresponding Korean Application No. 10-2020-7017998 .
Office Action for Japanese Application 2019559752 issued on Feb. 1, 2023.
Office Action for Japanese Application 2019559768 issued on Feb. 1, 2023.
Office Action for Japanese Application 2019559769 issued on Feb. 3, 2023.
Notice of Allowance for Korean Application No. 10-2020-7018044 issued on Mar. 8, 2023.

(56) References Cited

OTHER PUBLICATIONS

Japanese Office Action JP2023102562 dated Apr. 6, 2024.
Korean Office Action KR1020247003790 dated Apr. 25, 2024.
Notice of Allowance from U.S. Appl. No. 17/731,672 dated Mar. 18, 2024.
Office Action from U.S. Appl. No. 18/158,254 dated Apr. 1, 2024.

DISPLAY SUBSTRATE AND DISPLAY DEVICE

This application is a continuation application of U.S. patent application Ser. No. 16/615,996, which is a continuation of International Application No. PCT/CN2019/078871, filed on Mar. 20, 2019. The International Application claims the benefits of Chinese Patent Application No. 201810639832.6, filed with the China National Intellectual Property Administration on Jun. 20, 2018. The afore-mentioned patent applications are hereby incorporated by reference in their entireties.

FIELD

This disclosure relates to the field of display technologies, and particularly to a display substrate and display device.

BACKGROUND

As the display technologies are developing, an all-screen panel with a high screen to panel ratio and an ultra-narrow bezel can greatly improve a visual effect over a general display panel, and thus has been widely favored. At present, a front camera, an earphone, a fingerprint recognition area, a physical button, etc., are typically arranged on the front face of a display device including an all-screen panel, e.g., a mobile phone, to photograph its user, to conduct a video session, to recognize a fingerprint, and to perform other functions. However the arrangement of these indispensable functional elements may hinder a screen to panel ratio from being improved.

SUMMARY

In first aspect, embodiments of this disclosure provide a display substrate including a display area including a first display sub-area and a second display sub-area;

a distribution density of pixels in the first display sub-area is greater than a distribution density of pixels in the second display sub-area;

the second display sub-area includes a plurality of third pixel elements, wherein each of the plurality of third pixel elements includes multiple sub-pixels, and a distance between any two adjacent sub-pixels in the each third pixel element is less than a distance between any two adjacent third pixel elements; and a light-emitting area of at least a part of the multiple sub-pixels in the second display sub-area is greater than a light-emitting area of sub-pixels, with a same light-emitting color as the part of the multiple sub-pixels, in the first display sub-area.

Optionally in the embodiments of this disclosure, the second display sub-area includes multiple columns of sub-pixels, at least two columns of sub-pixels in the second display sub-area are aligned with two corresponding columns of sub-pixels in the first display sub-area; and in a row direction, at least one column of sub-pixels in the first display sub-area are arranged between two adjacent columns of sub-pixels in the second display sub-area, wherein the row direction is perpendicular to a column direction.

Optionally in the embodiments of this disclosure, the plurality of third pixel elements in the second display sub-area are arranged in parallel rows and columns; third pixel elements arranged in adjacent rows are aligned, and third pixel elements arranged in adjacent columns are aligned.

Optionally in the embodiments of this disclosure, the each third pixel element includes a first sub-pixel, a second sub-pixel and a third sub-pixel; the second pixel is arranged between the adjacent first sub-pixel and third sub-pixel; second sub-pixels of third pixel elements on a same column are arranged on a straight line.

Optionally in the embodiments of this disclosure, among four closest sub-pixels in the second display sub-area, two second sub-pixels of the four closest sub-pixels are arranged in middle, and a first sub-pixel and a third pixel of the four closest sub-pixels are arranged on two sides of the two second sub-pixels, and a center of each of the two second sub-pixels, a center of the first sub-pixel, and a center of the third sub-pixel are connected to form a triangle.

Optionally in the embodiments of this disclosure, among three adjacent columns of sub-pixels in the second display sub-area, a middle column of sub-pixels are second sub-pixels, and two columns of sub-pixels on two sides of the middle column of sub-pixels are first sub-pixels and third sub-pixels; the first sub-pixels and the third sub-pixels are alternately arranged; the first sub-pixels and the third sub-pixels of the two columns of sub-pixels are arranged on a straight line.

Optionally in the embodiments of this disclosure, the first display sub-area includes first sub-pixels, second sub-pixels and third sub-pixels; the first display sub-area includes a plurality of second sub-pixel columns extending along a column direction, and sub-pixel columns arranged on an edge of the first display sub-area are second sub-pixel columns; sub-pixels, adjacent to the second sub-pixel columns arranged on the edge of the first display sub-area, in the second display sub-area are the first sub-pixels or the third sub-pixels.

Optionally in the embodiments of this disclosure, in the second display sub-area, a light-emitting area of a second sub-pixel is less than a light-emitting area of a third sub-pixel, and a size of a second sub-pixel in the column direction is less than half of a size of a third sub-pixel in the column direction.

Optionally in the embodiments of this disclosure, the first display sub-area includes multiple columns of sub-pixels; a part of the multiple columns of sub-pixels are the second sub-pixels, and the remaining columns of the multiple columns of sub-pixels are the first sub-pixels and the third sub-pixels alternately arranged, wherein the first sub-pixels and the third sub-pixels are arranged on a straight line.

Optionally in the embodiments of this disclosure, at least one sub-pixel has different shapes in the first display sub-area and the second display sub-area.

Optionally in the embodiments of this disclosure, in the first display sub-area, a quantity of the second sub-pixels is greater than a quantity of the first sub-pixels or a quantity of the third sub-pixels; in a sub-pixel column where the first sub-pixels and the third sub-pixels are alternately arranged, adjacent first sub-pixel and third sub-pixel form a triangle with a second sub-pixel of an adjacent column on left or right of the sub-pixel column, respectively.

Optionally in the embodiments of this disclosure, in the first display sub-area, a distance between centers of any two adjacent sub-pixels in a sub-pixel column is identical; and a distance between centers of any two adjacent sub-pixels in a sub-pixel row is identical.

Optionally in the embodiments of this disclosure, multiple sub-pixel rows of the first display sub-area each includes alternately arranged first sub-pixels and third sub-pixels, wherein in two adjacent sub-pixel rows of the multiple sub-pixel rows, first sub-pixels and third sub-pixels of one row of the two adjacent sub-pixel rows are arranged in a staggered arrangement with first sub-pixels and third sub-pixels of other row of the two adjacent sub-pixel rows, and the first sub-pixels and the third sub-pixels are arranged on a straight line in the row direction.

Optionally in the embodiments of this disclosure, the second display sub-area includes multiple rows of third pixel elements; in a row of third pixel elements, a straight line in the row direction passes through two adjacent third pixel elements; and two sub-pixels respectively arranged on two adjacent edges of the two adjacent third pixel elements are arranged on the straight line, wherein light-emitting colors of the two sub-pixels are different.

Optionally in the embodiments of this disclosure, the first sub-pixel emits blue light, the second sub-pixel emits green light and the third sub-pixel emits red light.

In second aspect, the embodiments of this disclosure further provide a display substrate including a display are including a first display sub-area and a second display sub-area, a distribution density of pixels in the first display sub-area is greater than a distribution density of pixels in the second display sub-area;

both the first display sub-area and the second display sub-area include multiple columns of sub-pixels parallel to each other, and a column of sub pixels in the first display sub-area are aligned with a corresponding column of sub pixels in second display sub-area; and a light-emitting area of at least a part of the multiple sub-pixels in the second display sub-area is greater than a light-emitting area of sub-pixels, with a same light-emitting color as the part of the multiple sub-pixels, in the first display sub-area.

Optionally, in the embodiments of this disclosure, the second display sub-area includes first sub-pixels, second sub-pixels and third sub-pixels; in the second display sub-area, a center of a first sub-pixel, a center of a second sub-pixel and a center of a third sub-pixel are connected to form an isosceles triangle; the first sub-pixel, the second sub-pixel and the third sub-pixel are adjacent to each other.

Optionally, in the embodiments of this disclosure, in the second display sub-area, two first sub-pixels and two third sub-pixels adjacent to each other form a rectangle, and a second sub-pixel is arranged in a center of the rectangle.

Optionally, in the embodiments of this disclosure, the second sub-pixels in the second display sub-area are arranged in multiple rows, the second sub-pixels in two adjacent rows of second sub-pixels are staggered.

Optionally, in the embodiments of this disclosure, the second display sub-area includes multiple columns of sub-pixels extending along the column direction; and in the columns direction, at least one sub-pixel column of the first display sub-area is arranged between at least two adjacent sub-pixel columns in the second display sub-area.

Optionally, in the embodiments of this disclosure, the first display sub-area includes first sub-pixels, second sub-pixels and third sub-pixels; and the first display sub-area includes multiple columns of second sub-pixels extending along the column direction, and a sub-pixel row at the edge of the first display sub-area is a second sub-pixel row.

Optionally, in the embodiments of this disclosure, the sub-pixels adjacent to the second sub-pixel column at the edge of the first display sub-area are first sub-pixels and third sub-pixels; and among the sub-pixels adjacent to the second sub-pixel column, a part of the sub-pixels arranged in the first display sub-area have the same color, and the remaining part of the sub-pixels arranged in the second display sub-area have the same color.

Optionally, in the embodiments of this disclosure, in the first display sub-area, a second sub-pixel can form a triangle with an adjacent first sub-pixel and an adjacent third sub-pixel, the adjacent first sub-pixel and the adjacent third sub-pixel can arranged at one side of a row where the second sub-pixel is located, or the adjacent first sub-pixel and the adjacent third sub-pixel can arranged at the other side of the row where the second sub-pixel is located.

Optionally, in the embodiments of this disclosure, in the second display sub-area, the first sub-pixel and the third sub-pixel closest to a row of second sub-pixels are alternately arranged along the row direction.

Optionally, in the embodiments of this disclosure, in the first display sub-area, first sub-pixels in one sub-pixel row are aligned with third sub-pixels in another sub-pixel row adjacent to the one sub-pixel row.

Optionally, in the embodiments of this disclosure, in the first display sub-area, first sub-pixels in one sub-pixel row are aligned with third sub-pixels in another sub-pixel row adjacent to the one sub-pixel row.

Optionally, in the embodiments of this disclosure, at least one sub-pixel in the second display sub-area and at least one sub-pixel in the first display sub-area with the same color as the at least one sub-pixel in the second display sub-area have effective light-emitting regions with different shapes.

Optionally, in the embodiments of this disclosure, the first sub-pixel emits blue light, the second sub-pixel 2 emits green light, and the third sub-pixel 3 emits red light.

Correspondingly the embodiments of this disclosure provide display device, the display device includes the above display substrate provided in the first aspect of embodiments of the present disclosure.

Correspondingly the embodiments of this disclosure further provide display device, the display device includes the above display substrate provided in the second aspect of embodiments of the present disclosure.

DETAILED DESCRIPTION OF THE EMBODIMENTS

Figure 1A:
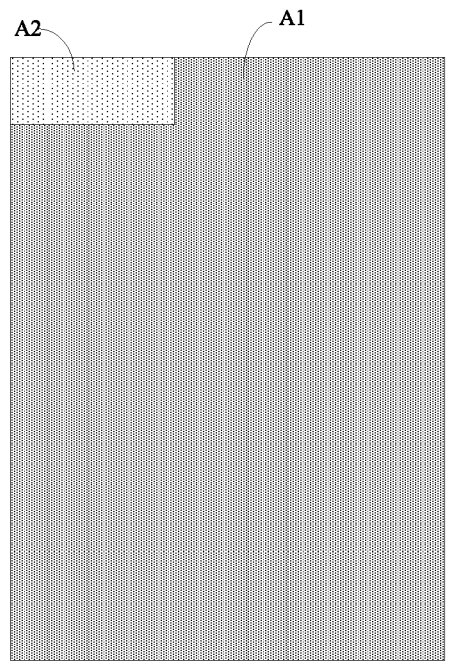
FIG. 1A is a first schematic structural diagram of a display substrate according to an embodiment of this disclosure.

The embodiments of this disclosure provide a display substrate, a method for driving the same, a display device, and a fine metal mask. In order to make the objects, technical solutions, and advantages of this disclosure more apparent, this disclosure will be described below in further details with reference to the drawings. Apparently the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

The shapes and the sizes of respective components in the drawings are not intended to reflect any real proportion, but only intended to illustrate the disclosure of this application.

As illustrated in FIG. 1A to FIG. 1I, a display substrate according to an embodiment of this disclosure includes a display area including a first display sub-area A1 and a second display sub-area A2, where a distribution density of pixels in the first display sub-area A1 is higher than a distribution density of pixels in the second display sub-area A2.

In the display substrate according to an embodiment of this disclosure, the display area includes the first display sub-area in which pixels are distributed at a high density (e.g., a high resolution), and the second display sub-area in which pixels are distributed at a low density (e.g., a low resolution). Since the distribution density of pixels in the second display sub-area is lower, a camera and other elements can be arranged in the second display sub-display area, that is, the distribution density of the local pixels can be lowered to thereby improve the transmittivity of a screen so as to improve a screen to panel ratio of the display substrate.

It shall be noted that the distribution density of pixels can refer to the number of pixels arranged uniformly in a unit of area. If there are a large number of pixels arranged in a unit of area, then there will be a high distribution density of pixels, and thus a high resolution; and if there are a small number of pixels arranged in a unit of area, then there will be a low distribution density of pixels, and thus a low resolution.

Furthermore in an embodiment of this disclosure, the distribution density of pixels is particularly calculated in the equation of $$\rho = \frac{\sqrt{x^2 + y^2}}{S},$$

where $\rho$ represents the distribution density of pixels, x represents the number of display elements in the row direction, y represents the number of display elements in the column direction, and S represents the area of a screen.

In a particular implementation, in the display substrate according to an embodiment of this disclosure, the number of second display sub-areas may be one or more; and the first display sub-area may be a consecutive area, or may be an inconsecutive area, dependent upon a real application environment, although an embodiment of the invention will not be limited thereto.

In a particular implementation, in the display substrate according to an embodiment of this disclosure, as illustrated in FIG. 1A to FIG. 1G, at least a part of sides of the second display sub-area A2 coincide with at least a part of sides of the display area, and the other sides of the second display sub-area A2 are surrounded by the first display sub-area A1, so that the second display sub-area A2 can be arranged at the edge of the display area.

Figure 1B:
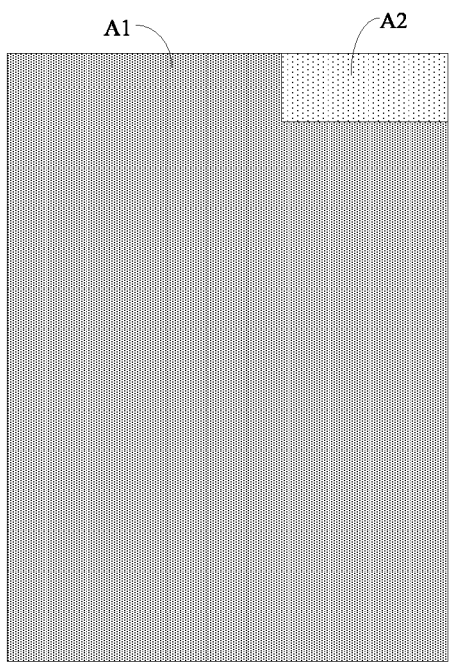
FIG. 1B is a second schematic structural diagram of the display substrate according to an embodiment of this disclosure.
Figure 1C:
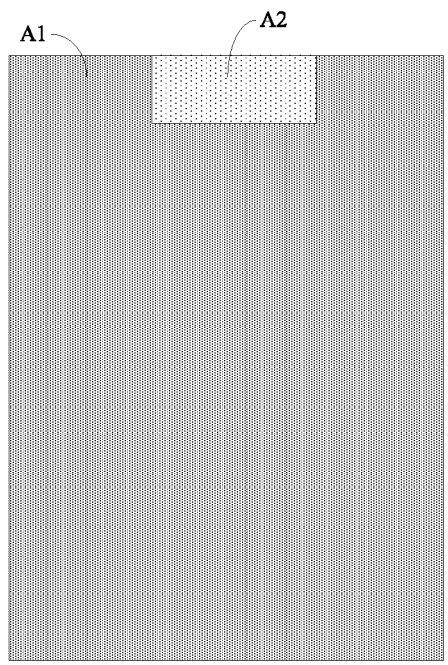
FIG. 1C is a third schematic structural diagram of the display substrate according to an embodiment of this disclosure.
Figure 1D:
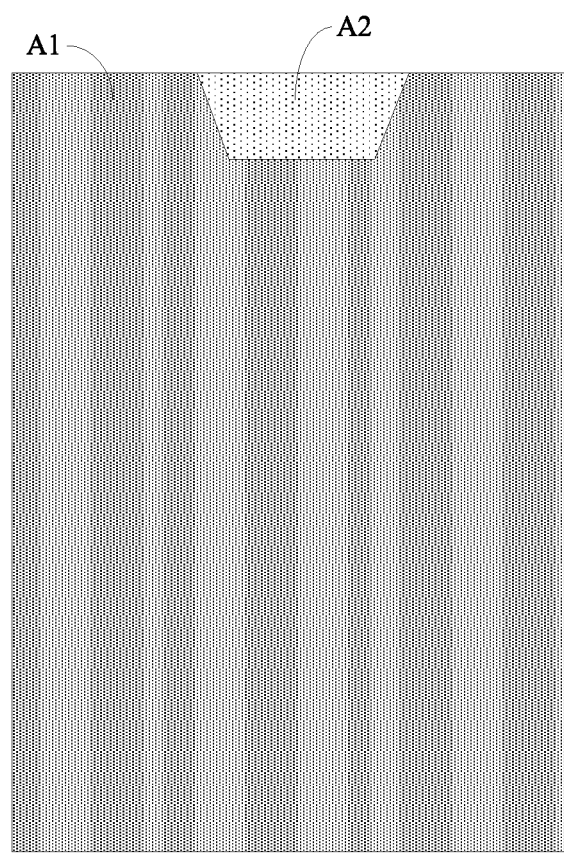
FIG. 1D is a fourth schematic structural diagram of the display substrate according to an embodiment of this disclosure.
Figure 1E:
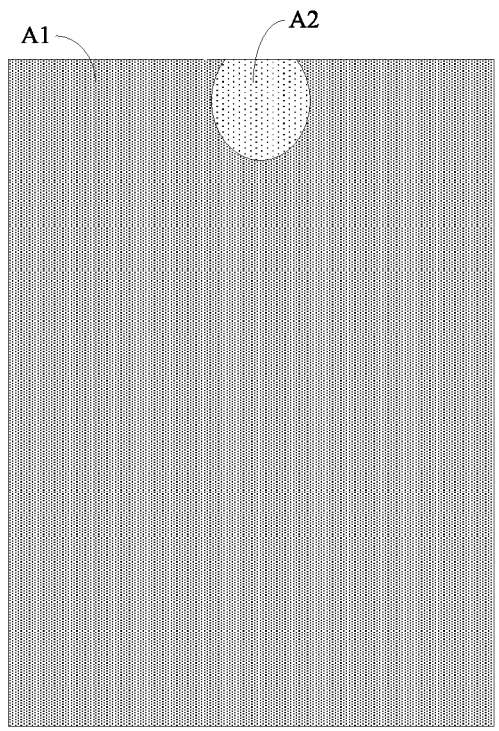
FIG. 1E is a fifth schematic structural diagram of the display substrate according to an embodiment of this disclosure.
Figure 1F:
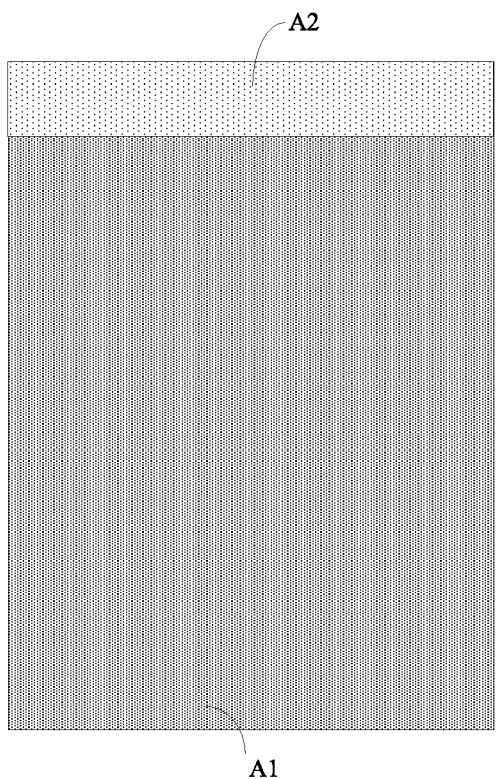
FIG. 1F is a sixth schematic structural diagram of the display substrate according to an embodiment of this disclosure.
Figure 1G:
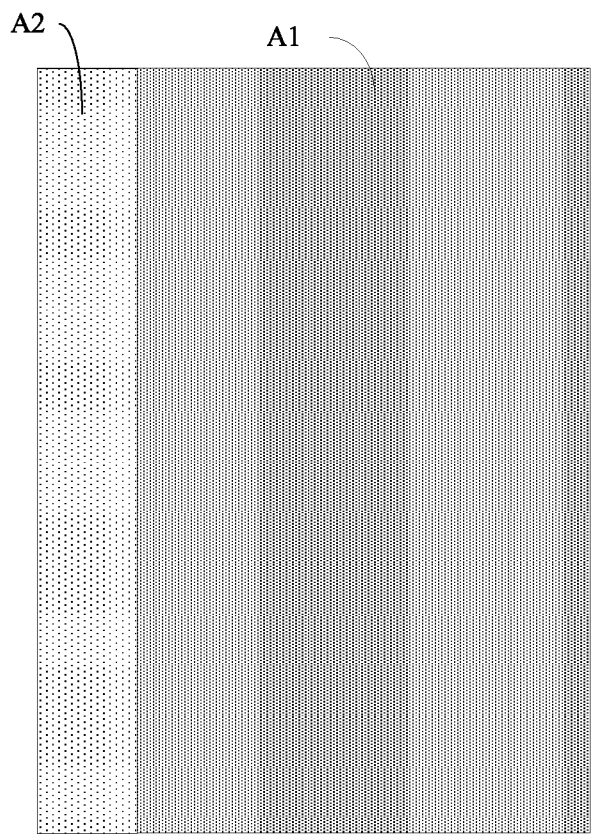
FIG. 1G is a seventh schematic structural diagram of the display substrate according to an embodiment of this disclosure.
Figure 1H:
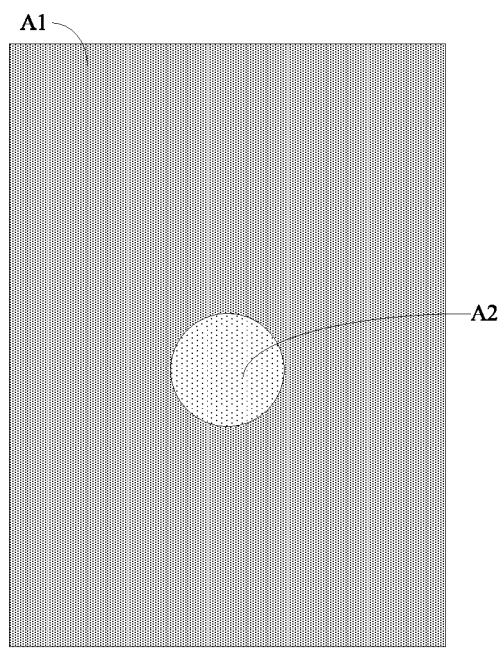
FIG. 1H is an eighth schematic structural diagram of the display substrate according to an embodiment of this disclosure.
Figure 1I:
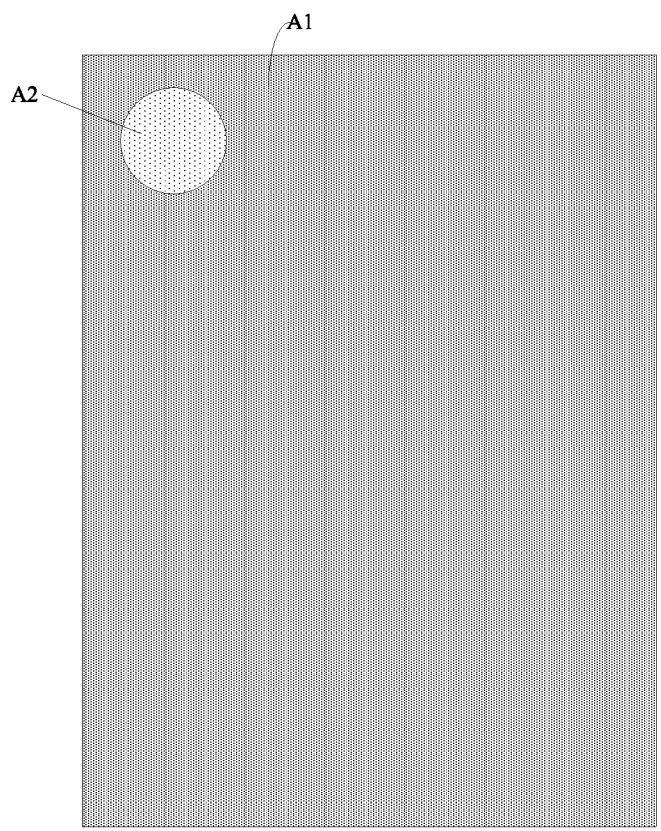
FIG. 1I is a ninth schematic structural diagram of the display substrate according to an embodiment of this disclosure.

In a particular implementation, in the display substrate according to an embodiment of this disclosure, as illustrated in FIG. 1H and FIG. 1I, the first display sub-area A1 is arranged to surround the second display sub-area A2 so that the second display sub-area A2 can be arranged in the display area.

Furthermore in a particular implementation, the shape of the second display sub-area A2 can be arranged as a regular shape, and as illustrated in FIG. 1A to FIG. 1C, for example, the second display sub-area A2 can be arranged as a rectangle, where a top corner of the rectangle can be a right angle or can be an arc angle. As illustrated in FIG. 1D, the second display sub-area A2 can be arranged as a trapezium, where a top corner of the trapezium can be a normal angle or can be an arc angle. As illustrated in FIG. 1H and FIG. 1I, the second display sub-area A2 can be arranged as a round. Of course, the shape of the second display sub-area A2 can be arranged as an irregular shape. As illustrated in FIG. 1E, for example, the second display sub-area A2 can be arranged as a drop shape. Of course, the shape of the second display sub-area can be designed according to the shape of an element arranged in the second display sub-area in a real application, although an embodiment of this disclosure will not be limited thereto.

Optionally in the display substrate according to an embodiment of this disclosure, as illustrated in FIG. 1A to FIG. 1I, the first display sub-area A1 and the second display sub-area A2 form the consecutive display area, and the shape of the display area is substantially rectangular, so that the first display sub-area A1 and the second display sub-area A2 can be formed as complementary patterns to form the consecutive display area. Furthermore, for example, if each top corner of the display area is a right angle, then the display area will be a rectangle, or if each top corner of the display area is an arc angle, then the shape of the display area will be substantially rectangular.

In a particular implementation, in the display substrate according to an embodiment of this disclosure, a relative positional relationship between the first display sub-area and the second display sub-area, and their shapes will not be limited to any particular relative positional relationship and shapes, but can be arranged according to a screen design of the display substrate. For a mobile phone, for example, the second display sub-area A2 can be arranged at the top-left corner of the first display sub-area A1 as illustrated in FIG. 1A. The second display sub-area A2 can be arranged at the top-right corner of the first display sub-area A1 as illustrated in FIG. 1B. The second display sub-area A2 can be arranged at the middle of the top of the first display sub-area A1 as illustrated in FIG. 1C to FIG. 1E. The first display sub-area A1 and the second display sub-area A2 can be arranged in the row direction as illustrated in FIG. 1F, where the second display sub-area A2 can be located above or below the first display sub-area A1. In this way, a sensor, e.g., a sensor for recognizing a human face (e.g., an infrared sensor, etc.), can be further arranged in the second display sub-area A2. The first display sub-area A1 and the second display sub-area A2 can be arranged in the column direction as illustrated in FIG. 1G, where the second display sub-area A2 can be located to the left or right of first display sub-area A1. In this way, a sensor, e.g., a sensor for recognizing a human face (e.g., an infrared sensor, etc.), can be further arranged in the second display sub-area A2. The second display sub-area A2 can be arranged at the center of the first display sub-area A1 as illustrated in FIG. 1H. The second display sub-area A2 can be arranged at a corner (e.g., the top-left corner) of the display area as illustrated in FIG. 1I. Of course, the particular position of the second display area A2 can be determined according to a real application environment in a real application, although an embodiment of the invention will not be limited thereto.

In a particular implementation, in the display substrate according to an embodiment of this disclosure, the distribution density of pixels in the second display sub-area is determined according to an element arranged in the second display sub-area, and a display demand, although an embodiment of the invention will not be limited thereto. For example, a camera is arranged in the second display sub-area, and if the distribution density of pixels is too high, then a good display effect will be guaranteed, but a definition of photographing may be degraded, or if the distribution density of pixels is too low, then a high definition of photographing will be guaranteed, but the display effect may be degraded. In a particular implementation, there is such an attainable resolution of the existing display substrate that the distribution density of pixels in the second display sub-area is generally no lower than the distribution density of pixels in the first display sub-area by a factor of ¼. For example, the distribution density of pixels in the second display sub-area is ½, ⅓, or ¼ of the distribution density of pixels in the first display sub-area. Of course, if the resolution of the display substrate is made higher, then the ratio of the distribution density of pixels in the second display sub-area to the distribution density in the first display sub-area may be set smaller.

In a particular implementation, in the display substrate according to an embodiment of this disclosure, as illustrated in FIG. 1A to FIG. 1I, the area of the second display sub-area A2 can be smaller than the area of the first display sub-area A1. Of course, the area of the second display sub-area can be designed according to an element arranged in the second display sub-area in a real application, although an embodiment of this disclosure will not be limited thereto.

Pixel elements are generally arranged in the display area, and each pixel element includes a plurality of sub-pixels; and a pixel in an embodiment of this disclosure may refer to a combination of sub-pixels which can display an image at a pixel point independently, and for example, a pixel may refer to a pixel element. Optionally in the display substrate according to an embodiment of this disclosure, as illustrated in FIG. 2 to FIG. 13, the first display sub-area A1 includes a plurality of first pixel elements 10 and second pixel elements 20 arranged adjacent to each other, where each first pixel element 10 includes a first sub-pixel 1 and a second sub-pixel 2, and each second pixel element 20 includes a third sub-pixel 3 and a second sub-pixel 2. In order to display an image, the number of pixels in the first display sub-area A1 is equal to the sum of the number of first pixel elements 10, and the number of second pixel elements 20, that is, the pixels are arranged in a pan tile pattern in the first display sub-area A1, and the image can be displayed at the pixel elements at a higher resolution than a physical resolution by borrowing the sub-pixels in their adjacent pixel elements.

The second display sub-area A2 includes a plurality of third pixel elements 30, such as, each third pixel element 30 can be regarded a pixel island; and each third pixel element 30 includes a first sub-pixel 1, a second sub-pixel 2, and a third sub-pixel 3 arranged adjacent to each other. In order to display an image, the number of pixels in the second display sub-area A2 is equal to the number of third pixel elements 30, that is, a physical resolution of the pixels in the second display sub-area A2 is the display definition thereof. Moreover in this embodiment, only an arrangement pattern of the third pixel elements 30 in the second display sub-area is illustrated, but a distribution density of the third pixel elements 30 in the second display sub-area A2 will not be limited to any particular distribution density.

It shall be noted that each pixel element can be a combination of sub-pixels at a pixel point, and for example, can be a combination of three, three, four or more of red, green, and blue sub-pixels, or each pixel element can be a combination of repeating elements or pixels, e.g., a combination of red, green, and blue sub-pixels.

In a particular implementation, in the display substrate according to an embodiment of this disclosure, two adjacent pixel elements refer to two pixel elements between which there is not any other pixel element. Two adjacent sub-pixels refer to two sub-pixels between which there is not any other sub-pixel.

It shall be noted that in the display substrate according to an embodiment of this disclosure, since there is a limited space at the edge of a display sub-area, the arrangement of sub-pixels in the first display sub-area, and the arrangement of sub-pixels in the second display sub-area generally refer to the arrangements of sub-pixels inside the display sub-areas, and there may be a different arrangement of some sub-pixels at the edge of the display sub-area, although an embodiment of this disclosure will not be limited thereto.

In a particular implementation, the first sub-pixels, the second sub-pixels, and the third sub-pixels are generally one of red, green, and blue sub-pixels respectively. Optionally in the display substrate according to an embodiment of this disclosure, the second sub-pixels are green sub-pixels, the first sub-pixels are red or blue sub-pixels, and the third sub-pixels are blue or red sub-pixels.

Figure 2:
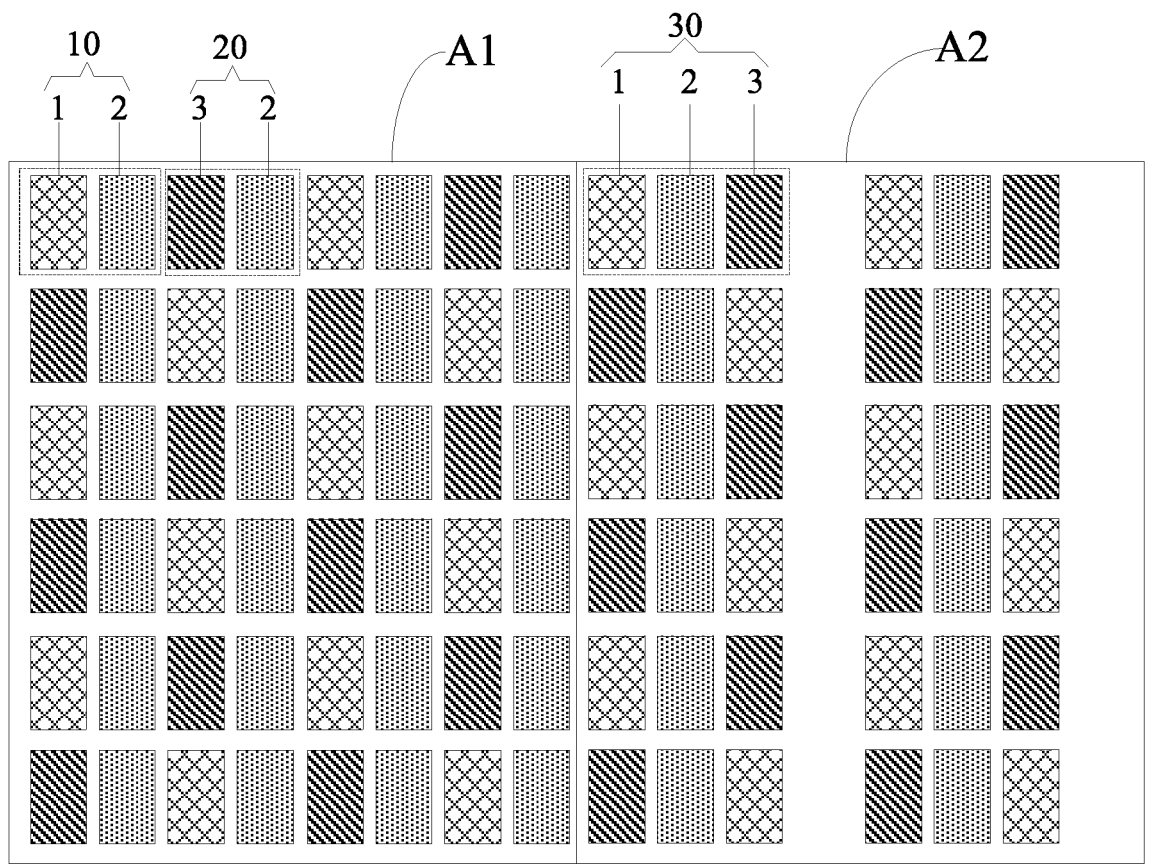
FIG. 2 is a first schematic structural diagram of a part of the display substrate according to an embodiment of this disclosure.
Figure 3:
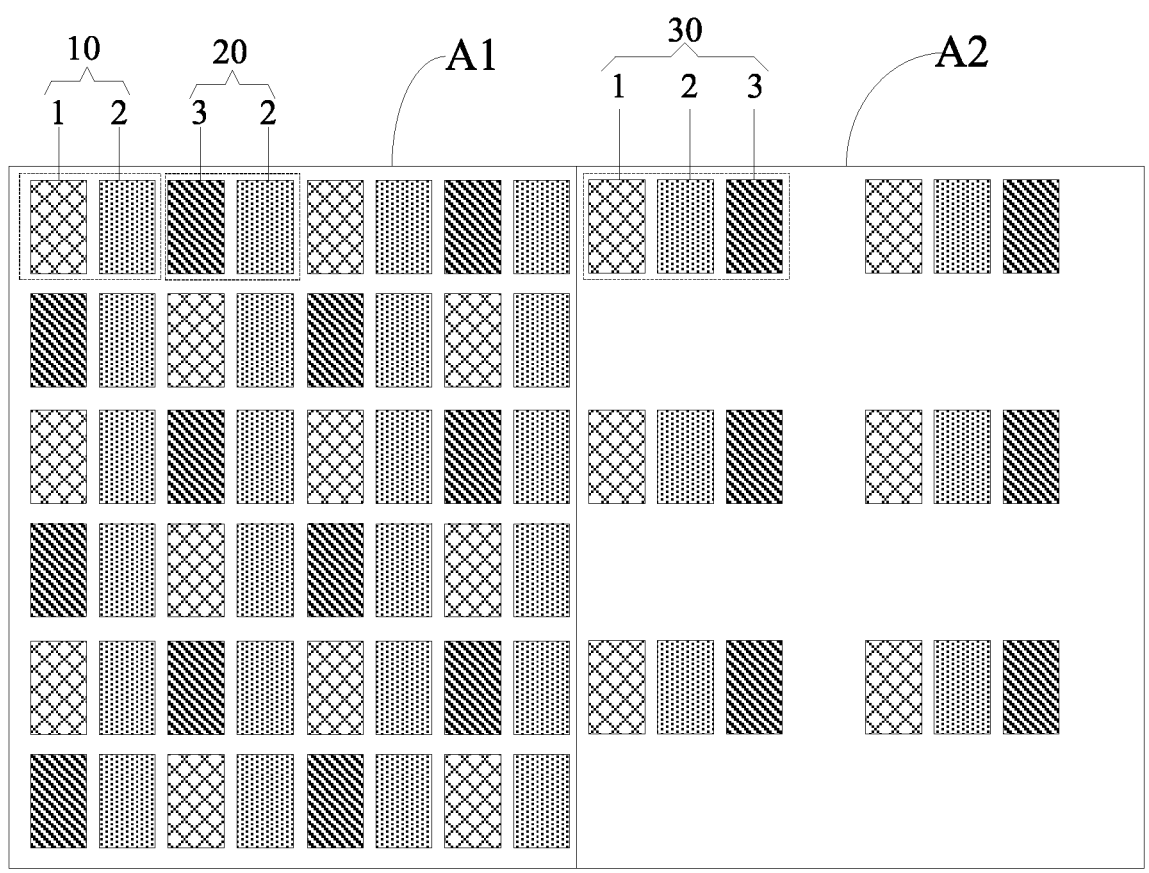
FIG. 3 is a second schematic structural diagram of a part of the display substrate according to an embodiment of this disclosure.
Figure 4:
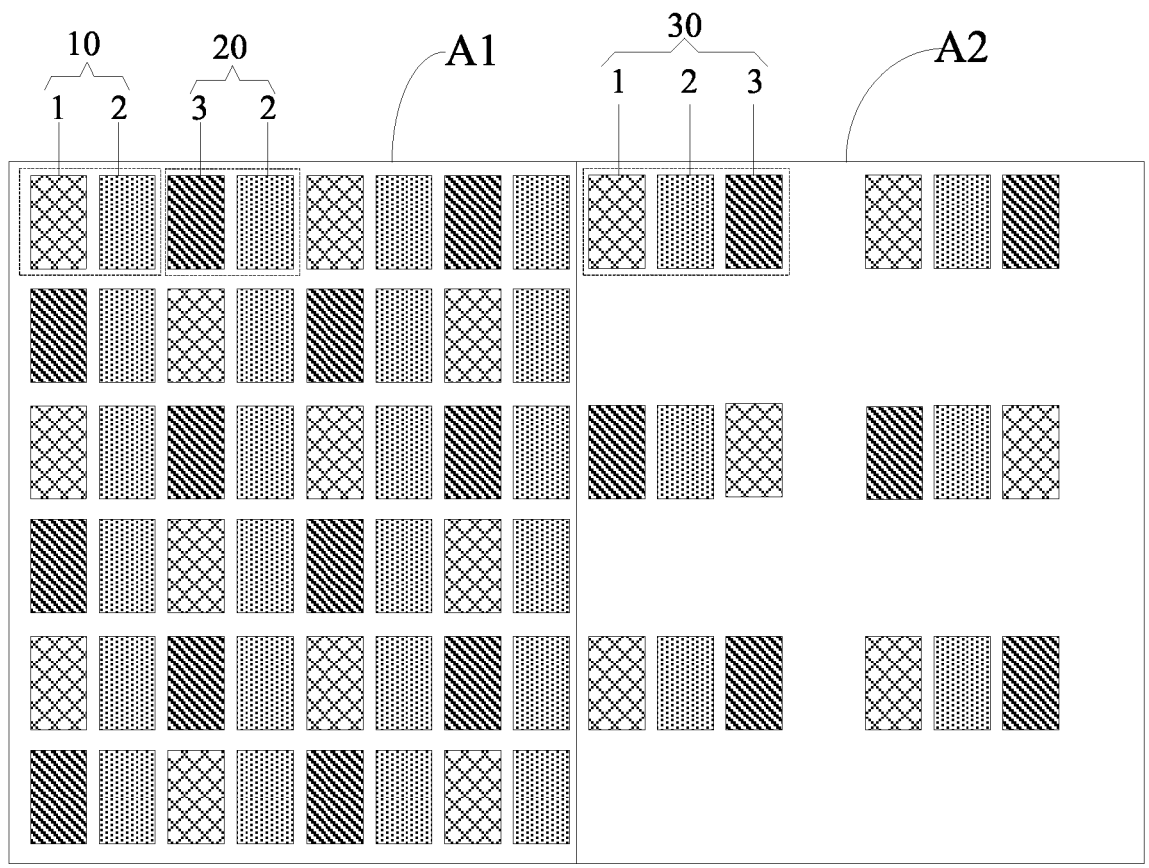
FIG. 4 is a third schematic structural diagram of a part of the display substrate according to an embodiment of this disclosure.

Optionally in the display substrate according to an embodiment of this disclosure, as illustrated in FIG. 2 to FIG. 5, the sub-pixels in the second display sub-area A2 can be located in the same row as a part of the sub-pixels in the first display sub-area A1 so that the sub-pixels in the second display sub-area A2 correspond in row direction to the sub-pixels in the first display sub-area A1 instead of being arranged in a different row or column from the latter sub-pixels. In this way, the display substrate is fabricated in such a way that equivalently a part of the sub-pixels in the second display sub-area in a sub-pixel mask originally arranged regularly throughout the display area are removed, thus making it relatively easy to perform a fabrication process. Optionally in the display substrate according to an embodiment of this disclosure, as illustrated in FIG. 6 to FIG. 13, the sub-pixels in the second display sub-area A2 can be located in the same column as a part of the sub-pixels in the first display sub-area A1 so that the sub-pixels in the second display sub-area A2 correspond in column direction to the sub-pixels in the first display sub-area A1 instead of being arranged in a different row or column from the latter sub-pixels. In this way, the display substrate is fabricated in such a way that a part of the sub-pixels in the second display sub-area in a sub-pixel mask originally arranged regularly throughout the display area are removed, thus making it relatively easy to perform a fabrication process. As illustrated in FIG. 2, for example, equivalently a half of the second sub-pixels in the second display sub-area A2 are removed as compared with the first display sub-area A1, so the resolution of the second display sub-area A2 is ½ of the resolution of the first display sub-area A1. As illustrated in FIG. 3, for example, equivalently ¾ of the second sub-pixels in the second display sub-area A2 are removed as compared with the first display sub-area A1, so the resolution of the second display sub-area A2 is ¼ of the resolution of the first display sub-area A1.

Optionally in the display substrate according to an embodiment of this disclosure, as illustrated in FIG. 2 to FIG. 8, a light-emitting area of a first sub-pixel 1 in the second display sub-area A2 is substantially equal to a light-emitting area of a first sub-pixel 1 in the first display sub-area A1, and a light-emitting area of a third sub-pixel 3 in the second display sub-area A2 is substantially equal to a light-emitting area of a third sub-pixel 3 in the first display sub-area A1. As illustrated in FIG. 2 to FIG. 7, a light-emitting area of a second sub-pixel 2 in the second display sub-area A2 is substantially equal to a light-emitting area of a second sub-pixel 2 in the first display sub-area A1.

In a particular implementation, the distribution density of pixels in the second display sub-area is lower than the distribution density of pixels in the first display sub-area, so in order to display an image, brightness in the second distribution density of pixels is lower than brightness in the first distribution density of pixels so that there may be an apparent dark strip visible to human eyes, at the interface between the first display sub-area and the second display sub-area. Optionally in order to alleviate the dark strip, in the display substrate according to an embodiment of this disclosure, as illustrated in FIG. 9 to FIG. 13, a light-emitting area of a first sub-pixel 1 in the second display sub-area A2 is larger than a light-emitting area of a first sub-pixel 1 in the first display sub-area A1, a light-emitting area of a second sub-pixel 2 in the second display sub-area A2 is larger than a light-emitting area of a second sub-pixel 2 in the first display sub-area A1, and a light-emitting area of a third sub-pixel 1 in the second display sub-area A2 is larger than a light-emitting area of a third sub-pixel 1 in the first display sub-area A1, that is, the light-emitting areas of the sub-pixels in the second display sub-area A2 can be increased to thereby lower the difference in brightness between the second display sub-area A2 and the first display sub-area A1 so as to alleviate the dark strip at the interface between the second display sub-area A2 and the first display sub-area A1.

Optionally in the display substrate according to an embodiment of this disclosure, a plurality of third pixel elements 30 are arranged in a matrix in the second display sub-area A2 as illustrated in FIG. 2 to FIG. 5, and FIG. 7 to FIG. 10.

Figure 6:
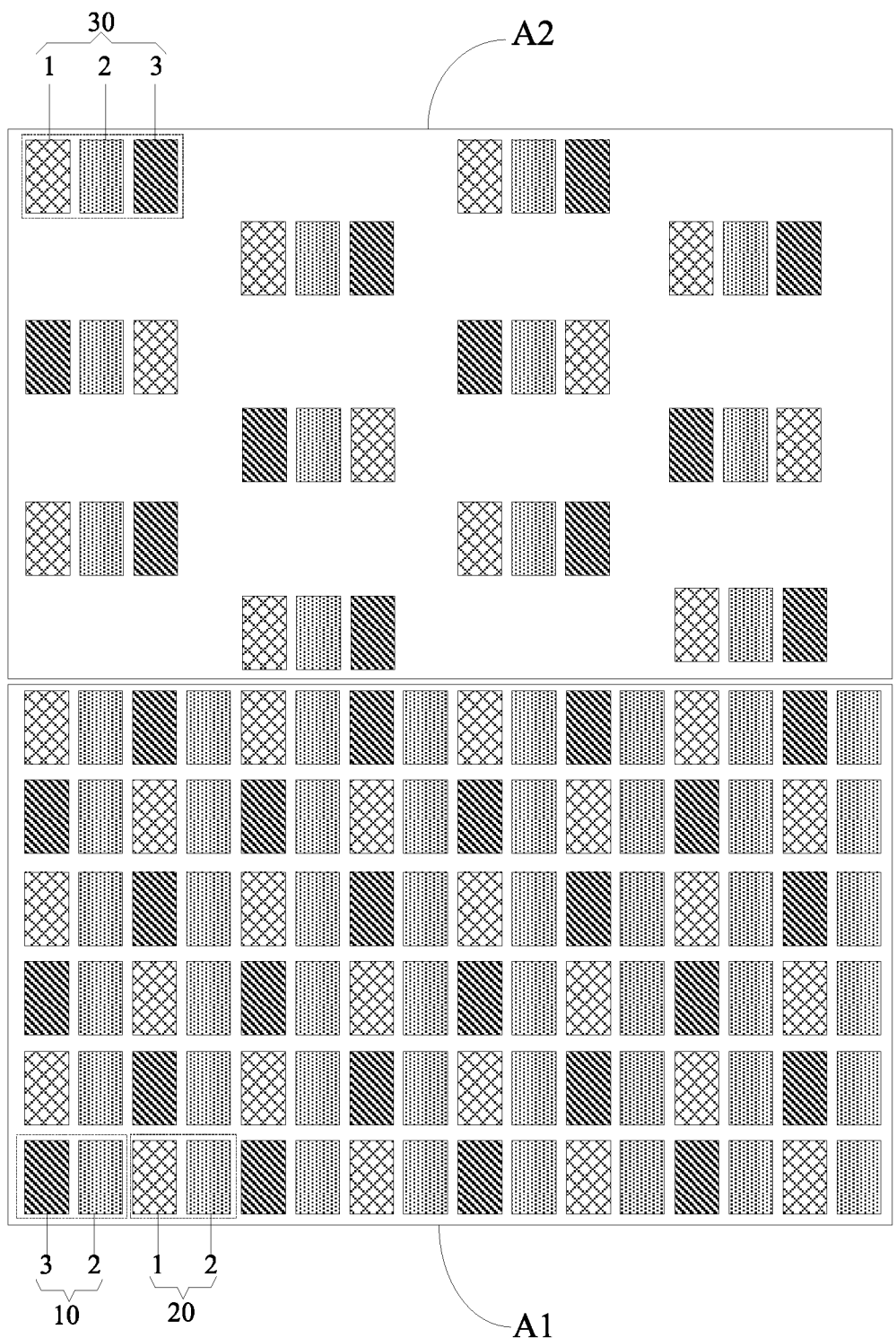
FIG. 6 is a fifth schematic structural diagram of a part of the display substrate according to an embodiment of this disclosure.

Optionally in the display substrate according to an embodiment of this disclosure, a plurality of third pixel elements 30 are arranged in a tessellated pattern in the second display sub-area A2 as illustrated in FIG. 6, and FIG. 11 to FIG. 13, that is, the third pixel elements 30 are arranged in every other column in the row direction, and in every other row in the column direction. As illustrated in FIG. 6, for example, the third pixel elements 30 in the odd rows are arranged in the odd columns, and the third pixel elements 30 in the even rows are arranged in the even rows, so that the third pixel elements 30 are distributed uniformly in both the row direction and the column direction, thus resulting in uniform brightness in the second display sub-area A2. For example, alternatively the third pixel elements 30 in the odd rows can be arranged in the even columns, and the third pixel elements 30 in the even rows can be arranged in the odd columns, so that any two third pixel elements are spaced from each other by a specific spacing, where for example, the spacing can be the length of at least one third pixel element in the row direction, and the length of at least one third pixel element in the column direction, although an embodiment of this disclosure will not be limited thereto.

Figure 5:
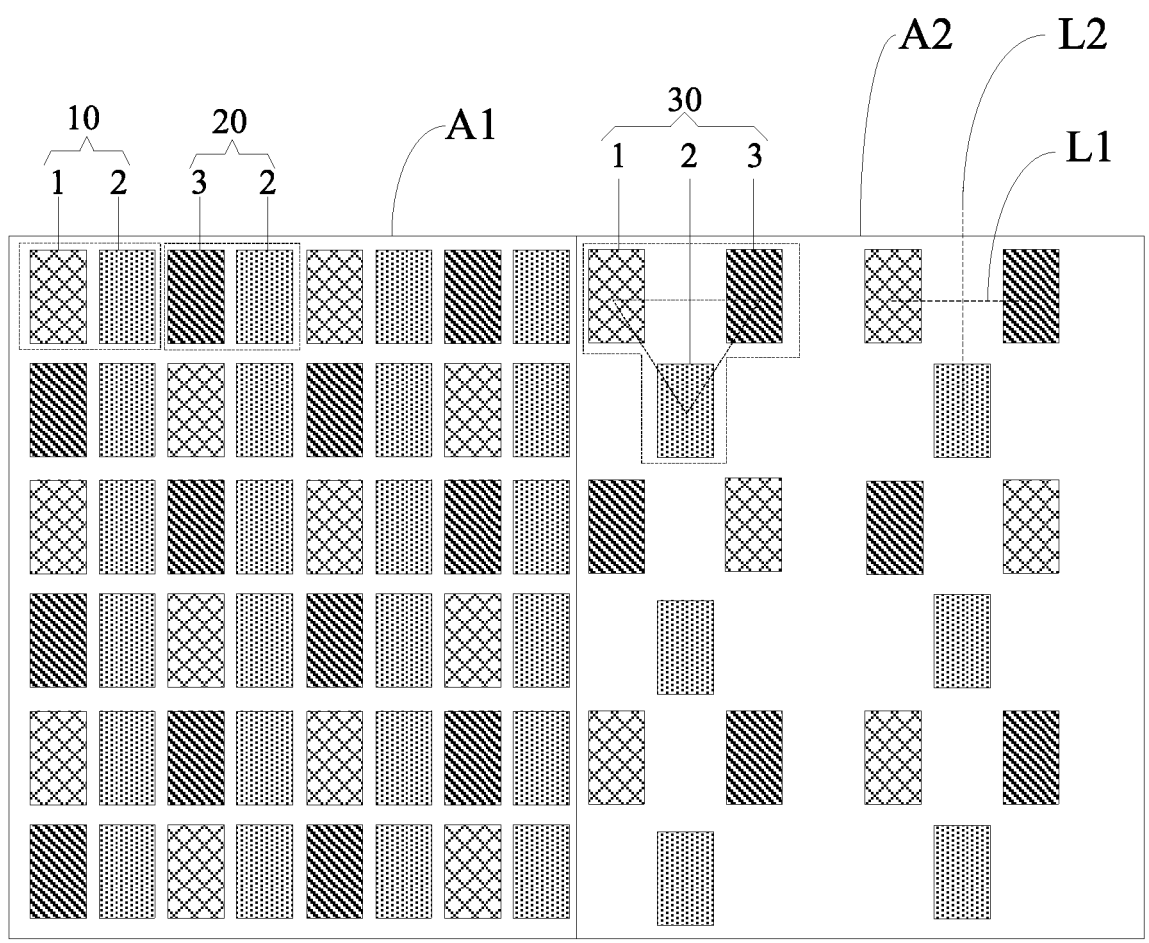
FIG. 5 is a fourth schematic structural diagram of a part of the display substrate according to an embodiment of this disclosure.
Figure 10:
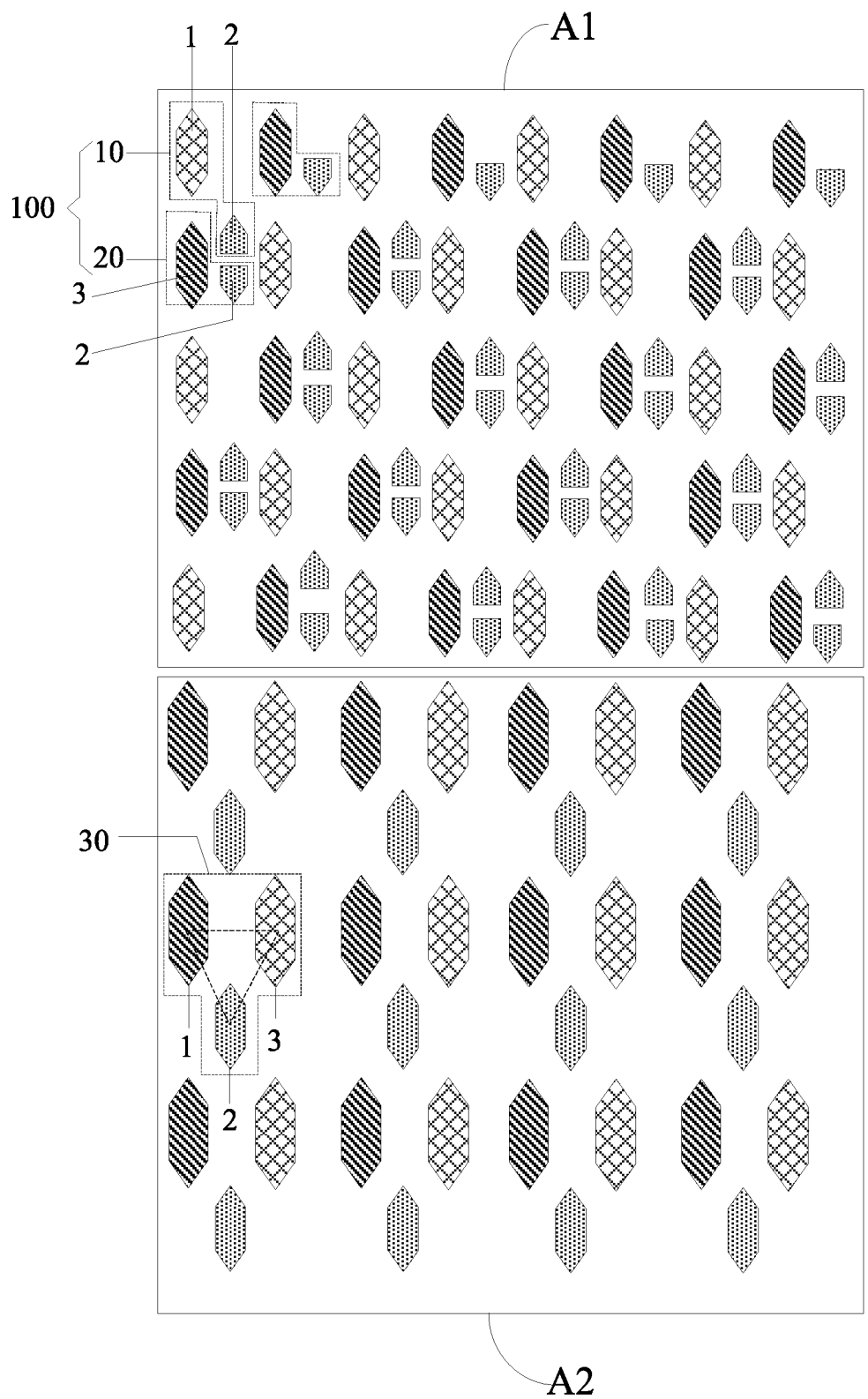
FIG. 10 is a ninth schematic structural diagram of a part of the display substrate according to an embodiment of this disclosure.

Optionally in the display substrate according to an embodiment of this disclosure, as illustrated in FIG. 5 and FIG. 10, in each third pixel element 30 in the second display sub-area A2, the first sub-pixel 1 and the third sub-pixel 3 are arranged in the same row, and the second sub-pixel 2 is located in an adjacent row to the row in which the first sub-pixel 1 and the third sub-pixel 3 are located. For example, the first sub-pixel 1 and the third sub-pixel 3 in the same third pixel element 30 are located in the first row, and the second sub-pixel 2 is located in the second row, so that lines connecting the centers of the first sub-pixel, the second sub-pixel, and the third sub-pixel in the same third pixel element 30 constitute a triangle to thereby avoid traverse bright and dark strips from occurring in the second display sub-area.

It shall be noted that in the display substrate according to an embodiment of this disclosure, the center of a sub-pixel refers to the center of a light-emitting area of the sub-pixel. Taking an OLED display panel as an example, a sub-pixel generally includes an anode layer, a light-emitting layer, and a cathode layer structured in a stack, where in order to display an image, the light-emitting area corresponding to the stack structure is a light-emitting area of the sub-pixel, so that the area occupied by the light-emitting area is a light-emitting area. Of course, the light-emitting area can alternatively be an area occupied by an opening area defined by the pixel definition layer, for example, although an embodiment of this disclosure will not be limited thereto.

Optionally in the display substrate according to an embodiment of this disclosure, as illustrated in FIG. 5 and FIG. 10, in the same third pixel element 30, an orthographical projection of the center of the second sub-pixel 2 onto the line L1 connecting the center of the first sub-pixel 1 with the center of the third sub-pixel 3 lies between the center of the first sub-pixel 1, and the center of the third sub-pixel 3. For example, the orthographical projection of the center of the second sub-pixel 2 onto the line L1 connecting the center of the first sub-pixel 1 with the center of the third sub-pixel 3 lies onto the intersection between the connecting line L1 and the straight line L2. In this way, the distance between the center of the second sub-pixel 2, and the center of the first sub-pixel 1 in the third pixel element 30 can be equal to the distance between the center of the second sub-pixel 2, and the center of the third sub-pixel 3 so that these three sub-pixels are arranged in an isosceles triangle pattern to thereby avoid vertical bright and dark strips from occurring in the second display sub-area A2.

In a particular implementation, the distance between the center of the second sub-pixel 2, and the center of the first sub-pixel 1 may not be exactly equal to the distance between the center of the second sub-pixel 2, and the center of the third sub-pixel 3, and there may be some error due to a limiting process condition or another factor, e.g., an arrangement of wires or through-holes, in a real process, so the shapes and the positions of the respective sub-pixels, and their relative positional relationship can substantially satisfy the condition above without departing from the scope of this disclosure.

Optionally in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged in the same row or column in the second display sub-area A2, although an embodiment of this disclosure will not be limited thereto.

Of course, in a particular implementation, in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged successively in the same row or column in the second display sub-area A2, although an embodiment of this disclosure will not be limited thereto. Furthermore, of course, in a particular implementation, in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged adjacent to each other in order in the same row or column in the second display sub-area A2, although an embodiment of this disclosure will not be limited thereto.

Optionally in the display substrate according to an embodiment of this disclosure, as illustrated in FIG. 2, FIG. 4 to FIG. 6, and FIG. 12, in the second display sub-area A2, the sub-pixels in two third pixel elements 30 adjacent in the row direction are arranged in the same order in the row direction, and the sub-pixels in two third pixel elements 30 adjacent in the column direction are arranged in opposite orders in the row direction, so that the first sub-pixels 1 and the third sub-pixels 3 can be arranged alternately in the column direction in the second display sub-area A2 to thereby avoid a color crosstalk from occurring in the column direction. As illustrated in FIG. 2, for example, taking the first row of third pixel elements 30 as an example, the first sub-pixel 1, the second sub-pixel 2, and the third sub-pixel 3 in each of two adjacent third pixel elements 30 are arranged successively from the left to the right in the row direction. Taking the first column of third pixel elements 30 as an example, in the column direction, the first sub-pixel 1, the second sub-pixel 2, and the third sub-pixel 3 in each third pixel element 30 in an odd row are arranged successively from the left to the right, and the first sub-pixel 1, the second sub-pixel 2, and the third sub-pixel 3 in each third pixel element 30 in an even row are arranged successively from the left to the right. As illustrated in FIG. 5, for example, taking the first row of third pixel elements 30 as an example, the first sub-pixel 1, the second sub-pixel 2, and the third sub-pixel 3 in each of two adjacent third pixel elements 30 are arranged in an upside-down triangle pattern in the row direction. Taking the first column of third pixel elements 30 as an example, in the column direction, the first sub-pixel 1, the second sub-pixel 2, and the third sub-pixel 3 in each third pixel element 30 in an odd row are arranged in an upside-down triangle patter, and the first sub-pixel 1, the second sub-pixel 2, and the third sub-pixel 3 in each third pixel element 30 in an even row are arranged in an upside-down triangle patter.

In a particular implementation, in the display substrate according to an embodiment of this disclosure, the sub-pixels in each third pixel element in the second display sub-area A2 can be arranged in the same order as illustrated in FIG. 2, and FIG. 7 to FIG. 11.

Figure 13:
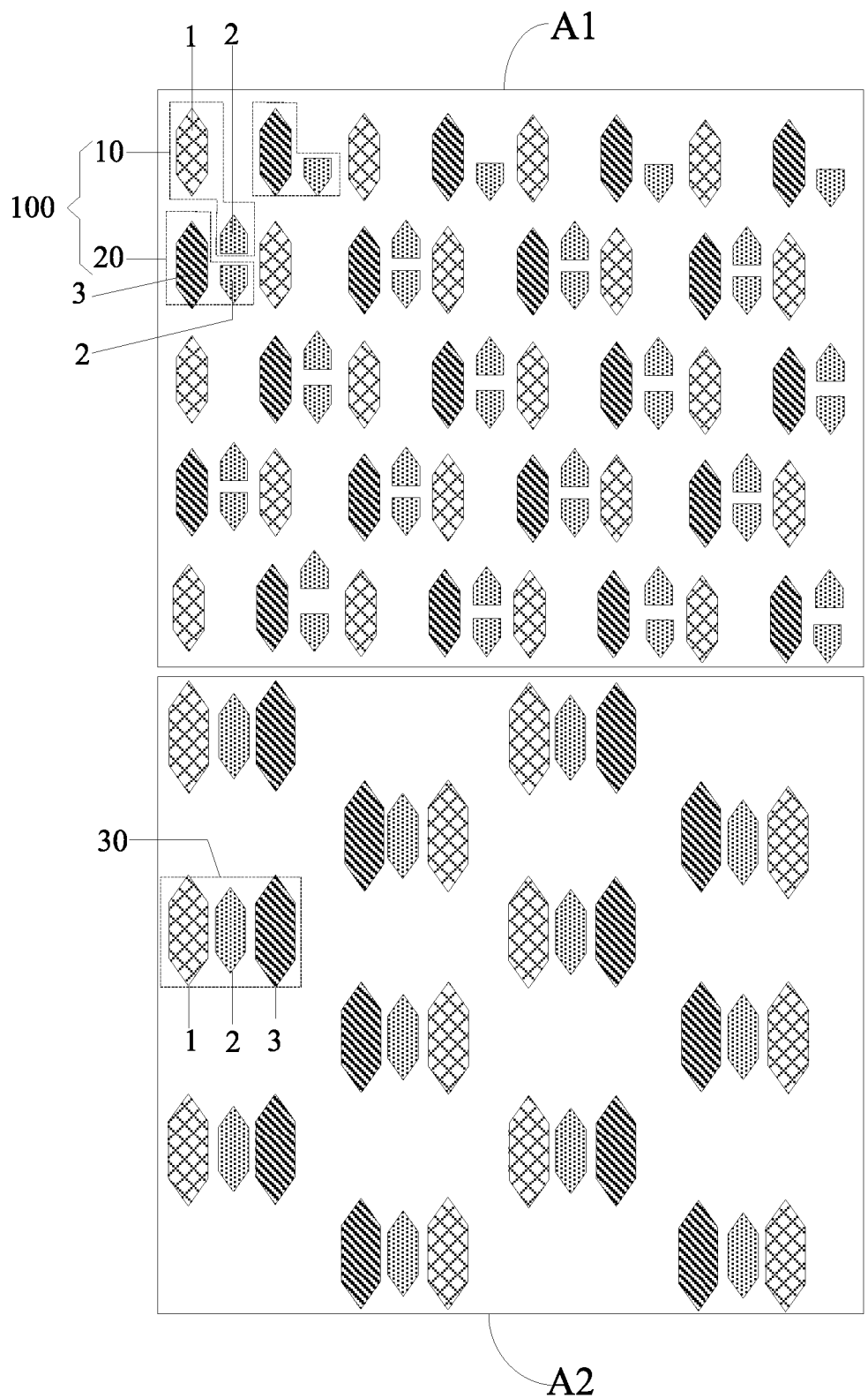
FIG. 13 is a twelfth schematic structural diagram of a part of the display substrate according to an embodiment of this disclosure.

In a particular implementation, in the display substrate according to an embodiment of this disclosure, the sub-pixels in each third pixel element 30 in the same column are arranged in the same order, and the sub-pixels in the third pixel elements 30 in two adjacent columns are arranged in opposite orders, in the second display sub-area A2 as illustrated in FIG. 13. For example, the first sub-pixel 1, the second sub-pixel 2, and the third sub-pixel 3 in each third pixel element 30 in an odd column are arranged successively from the left to the right, and the second sub-pixel 2, and the third sub-pixel 3 in each third pixel element 30 in an even column are arranged successively from the left to the right.

In a particular implementation, in the display substrate according to an embodiment of this disclosure, the shapes of the first sub-pixels 1, the second sub-pixels 2, and the third sub-pixels 3 are substantially the same in the second display sub-area A2 as illustrated in FIG. 2 to FIG. 6, and FIG. 8 to FIG. 13.

In a particular implementation, in the display substrate according to an embodiment of this disclosure, a light-emitting area of a second sub-pixel is smaller than or substantially equal to a light-emitting area of a first sub-pixel, and a light-emitting area of a second sub-pixel is smaller than or substantially equal to a light-emitting area of a third sub-pixel, in the second display sub-area. As illustrated in FIG. 2 to FIG. 6, for example, a light-emitting area of a second sub-pixel 2 is substantially equal to a light-emitting area of a first sub-pixel 1, and a light-emitting area of a second sub-pixel 2 is substantially equal to a light-emitting area of a third sub-pixel 3, in the second display sub-area A2. As illustrated in FIG. 7 to FIG. 13, a light-emitting area of a second sub-pixel 2 is smaller than to a light-emitting area of a first sub-pixel 1, and a light-emitting area of a second sub-pixel 2 is smaller than or substantially equal to a light-emitting area of a third sub-pixel 3, in the second display sub-area. Of course, the relationship between a light-emitting area of a second sub-pixel, a light-emitting area of a first sub-pixel, and a light-emitting area of a third sub-pixel in the second display sub-area can be determined according to a real application, although an embodiment of this disclosure will not be limited thereto.

In a particular implementation, in the display substrate according to an embodiment of this disclosure, as illustrated in FIG. 2 to FIG. 13, a light-emitting area of a first sub-pixel 1 is substantially equal to a light-emitting area of a third sub-pixel 3 in the second display sub-area A2.

Optionally in the display substrate according to an embodiment of this disclosure, as illustrated in FIG. 2 to FIG. 13, the first pixel elements 10 and the second pixel elements 20 in the first display sub-area A1 can be arranged in any pan tile pattern, although an embodiment of this disclosure will not be limited thereto.

Optionally in the display substrate according to an embodiment of this disclosure, as illustrated in FIG. 2 to FIG. 13, the first pixel elements 10 and the second pixel elements 20 are arranged alternately in the column direction, and the first pixel elements 10 and the second pixel elements 20 are arranged alternately in the row direction, in the first display sub-area A1.

Optionally in the display substrate according to an embodiment of this disclosure, as illustrated in FIG. 2 to FIG. 6, the second sub-pixel 2 and the first sub-pixel 1 in each first pixel element 10 are arranged in the same row, and the second sub-pixel 2 and the third sub-pixel 3 in each second pixel element 20 are arranged in the same row, in the first display sub-area A1; and for the first pixel element 10 and the second pixel element 20 adjacent in the row direction, the second sub-pixel 2 in the first pixel element 10 is not immediately adjacent to the second sub-pixel 2 in the second pixel element 20. For example, for the first pixel element 10 and the second pixel element 20 adjacent in the row direction, the second sub-pixel 2 in the first pixel element 10 is spaced from the second sub-pixel 2 in the second pixel element 20 by the third sub-pixel 3. Of course, there may be alternative implementations to the implementation above, and a repeated description thereof will be omitted here.

Furthermore in the display substrate according to an embodiment of this disclosure, as illustrated in FIG. 2 to FIG. 6, a light-emitting area of a first sub-pixel 1, a light-emitting area of a second sub-pixel 2, and a light-emitting area of a third sub-pixel 3 can be substantially the same in the first display sub-area A2.

Optionally in the display substrate according to an embodiment of this disclosure, as illustrated in FIG. 7 to FIG. 13, the second sub-pixel 2 and the first sub-pixel 1 in each first pixel element 10 are staggered in rows and columns, and the second sub-pixel 2 and the third sub-pixel 3 in each second pixel element 20 are arranged in the same row, in the first display sub-area A1; and the first pixel element 10 and the second pixel element 20 adjacent in the column direction are a group of pixels 100, and in the same group of pixels 100, the second sub-pixel 2 in the first pixel element 10, and the third sub-pixel 3 in the second pixel element 20 are arranged in the same row, and the second sub-pixel 2 in the first pixel element 10, and the second sub-pixel 2 in the second pixel element 20 are located in the same column.

Furthermore in the display substrate according to an embodiment of this disclosure, as illustrated in FIG. 7 to FIG. 12, two second sub-pixels 2 in the same group of pixels 100 are arranged adjacent to each other in the column direction, and the two second sub-pixels 2 are symmetric in the row direction even if they are arranged in a mirror pattern. Furthermore, in the first display sub-area A1, when the second sub-pixels 2 are green sub-pixels, the total light-emitting area of two second sub-pixels 2 is smaller than a light-emitting area of a first sub-pixel 1, and the total light-emitting area of two second sub-pixels 2 is smaller than a light-emitting area of a third sub-pixel 3, because the green sub-pixels have higher light-emission efficiency than that of the sub-pixels in the other colors.

Optionally in the display substrate according to an embodiment of this disclosure, as illustrated in FIG. 2 to FIG. 13, the sub-pixels in each first pixel element 10 are arranged in the same order, and the sub-pixels in each second pixel element 20 are arranged in the same order, in the first display sub-area. As illustrated in FIG. 2 to FIG. 6, for example, the first sub-pixel 1 and the second sub-pixel 2 in each first pixel element 10 are arranged successively from the left to the right, and the third sub-pixel 3 and the second sub-pixel 2 in each second pixel element 20 are arranged successively from the left to the right. As illustrated in FIG. 7 to FIG. 13, the second sub-pixel 2 and the third sub-pixel 3 in each second pixel element 20 are arranged successively from the left to the right, and the first sub-pixel 1 and the second sub-pixel 2 in each first pixel element 10 are arranged successively from the top left to the bottom right.

Optionally in the display substrate according to an embodiment of this disclosure, a light-emitting area of a second sub-pixel is not larger than a light-emitting area of a first sub-pixel, and a light-emitting area of a second sub-pixel is not larger than a light-emitting area of a third sub-pixel, in the first display sub-area. As illustrated in FIG. 2 to FIG. 6, for example, a light-emitting area of a second sub-pixel 2 is substantially equal to a light-emitting area of a first sub-pixel 1, and a light-emitting area of a second sub-pixel 2 is substantially equal to a light-emitting area of a third sub-pixel 3, in the first display sub-area A1. As illustrated in FIG. 7 to FIG. 13, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the first display sub-area A1. Since the number of first sub-pixels 1 is the same as the number of third sub-pixels 3, and the number of second sub-pixels 2 is twice the number of first sub-pixels 1, in the first display sub-area A1, the light-emitting area of each second sub-pixel 2 can be made smaller.

Optionally in the display substrate according to an embodiment of this disclosure, a light-emitting area of a first sub-pixel 1 is substantially equal to a light-emitting area of a third sub-pixel 3 in the first display sub-area A1 as illustrated in FIG. 2 to FIG. 13.

In the display substrate according to an embodiment of this disclosure, the shapes of the first sub-pixels, the second sub-pixels, and the third sub-pixels in the first display sub-area will not be limited to any particular shapes, and may be regular or irregular shapes. In a particular implementation, a regular shape is generally easy to form from the perspective of a process.

In the display substrate according to an embodiment of this disclosure, the shapes of the first sub-pixels, the second sub-pixels, and the third sub-pixels in the second display sub-area will not be limited to any particular shapes, and may be regular or irregular shapes. In a particular implementation, a regular shape is generally easy to form from the perspective of a process.

Optionally in the display substrate according to an embodiment of this disclosure, as illustrated in FIG. 7 to FIG. 12, the shapes of the first sub-pixel 1 and the third sub-pixel 3 are the same, and the shape of a combination of two second sub-pixels 2 is the same as the shape of the first sub-pixel 1 or the third sub-pixel 3, in the same group of pixels 100.

Optionally in the display substrate according to an embodiment of this disclosure, the shape of a first sub-pixel is at least one of a rectangle and a hexagon. As illustrated in FIG. 2 to FIG. 6, for example, the shape of a first sub-pixel 1 in each of the first display sub-area A1 and the second display sub-area A2 is rectangular. As illustrated in FIG. 7 to FIG. 12, the shape of a first sub-pixel 1 in each of the first display sub-area A1 and the second display sub-area A2 is hexagonal. Of course, the shape of a first sub-pixel can alternatively be a rounded shape, elliptic, etc., although an embodiment of this disclosure will not be limited thereto.

Optionally in the display substrate according to an embodiment of this disclosure, as illustrated in FIG. 7 to FIG. 12, both of the shapes of the first sub-pixels 1 and the third sub-pixels 3 are hexagonal, and the shape of a combination of two sub-pixels 2 is hexagonal, in the first display sub-area A1.

Optionally in the display substrate according to an embodiment of this disclosure, the shape of at least one of a first sub-pixel and a third sub-pixel in the second display sub-area is substantially the same as the shape of a first sub-pixel in the first display sub-area. As illustrated in FIG. 2 to FIG. 13, for example, the shape of a first sub-pixel 1 in the second display sub-area A2 is substantially the same as the shape of a first sub-pixel 1 in the first display sub-area A1. As illustrated in FIG. 2 to FIG. 13, the shape of a third sub-pixel 3 in the second display sub-area A2 is substantially the same as the shape of a first sub-pixel 1 in the first display sub-area A1. As illustrated in FIG. 2 to FIG. 13, the shape of a first sub-pixel 1, and the shape of a third sub-pixel 3 respectively in the second display sub-area A2 are substantially the same as the shape of a first sub-pixel 1 in the first display sub-area A1.

Figure 7:
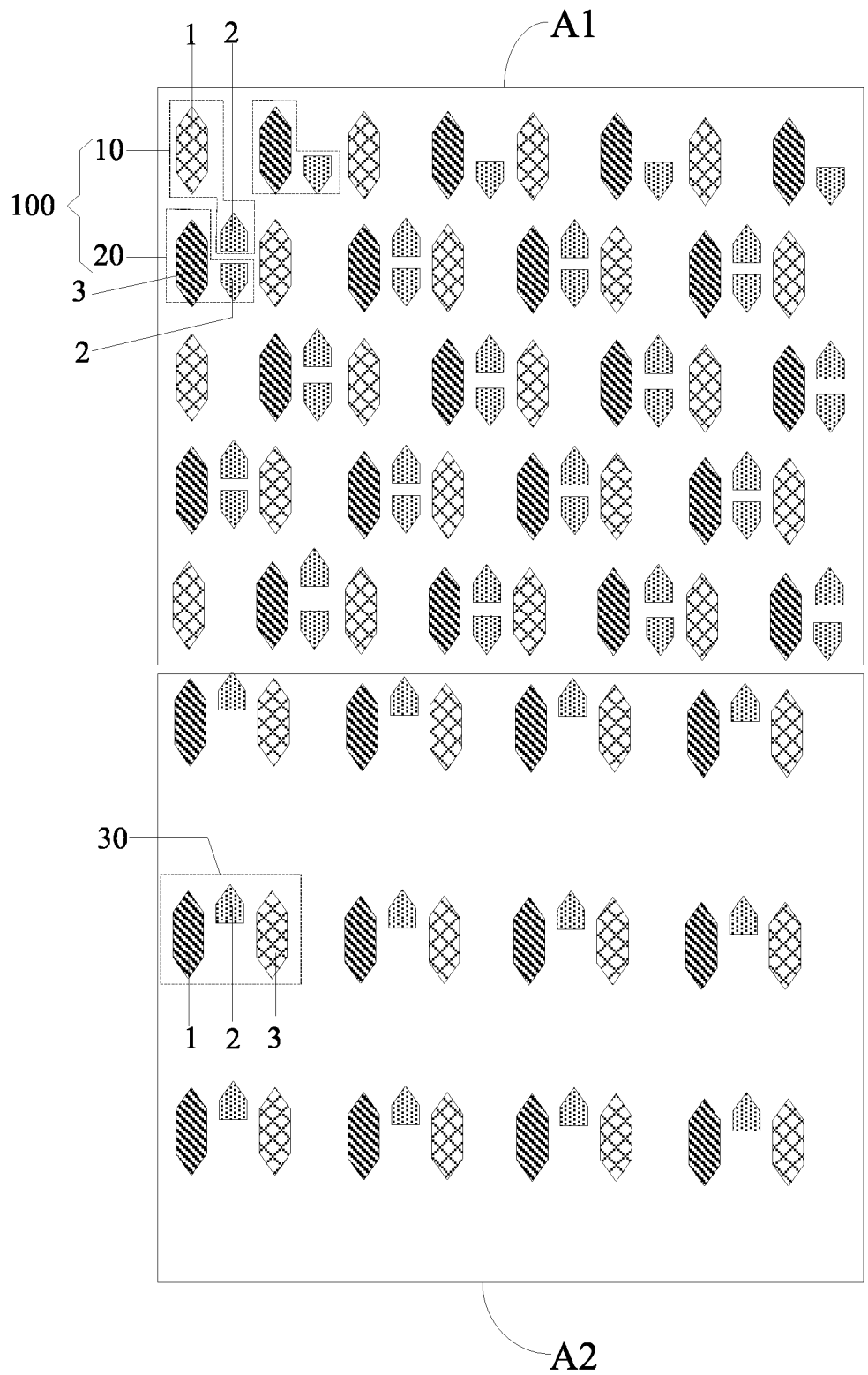
FIG. 7 is a sixth schematic structural diagram of a part of the display substrate according to an embodiment of this disclosure.

Optionally in the display substrate according to an embodiment of this disclosure, the shape of one of a first sub-pixel and a second sub-pixel in the first display sub-area is substantially the same as the shape of a second sub-pixel in the second display sub-area. As illustrated in FIG. 2 to FIG. 6, and FIG. 8 to FIG. 13, for example, the shape of a first sub-pixel 1 in the first display sub-area A1 is substantially the same as the shape of a second sub-pixel 2 in the second display sub-area A2. As illustrated in FIG. 7, the shape of a second sub-pixel 2 in the first display sub-area A1 is substantially the same as the shape of a second sub-pixel 2 in the second display sub-area A2.

It shall be noted the shapes of the respective first sub-pixels 1, the respective second sub-pixels 2, and the respective third sub-pixels 3 in the same sub-area are substantially the same, and although there is substantially the same shape of these three kinds of sub-pixels, there may be different light-emitting areas thereof. As illustrated in FIG. 10, for example, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the second display sub-area A2. In a real application, for example, they can be arranged in an implementation in which a light-emitting area of a blue sub-pixel is larger than a light-emitting area of a red sub-pixel, which is larger than a light-emitting area of a green sub-pixel, or a light-emitting area of a blue sub-pixel is larger than a light-emitting area of a green sub-pixel, which is larger than a light-emitting area of a red sub-pixel, although an embodiment of this disclosure will not be limited thereto.

It shall be noted that in the display substrate according to an embodiment of this disclosure, the shape of a sub-pixel refers to the shape of a light-emitting area of the sub-pixel.

Optionally in the display substrate according to an embodiment of this disclosure, as illustrated in FIG. 7 to FIG. 12, when the second sub-pixels 2 in the first display sub-area A1 are green sub-pixels, the total light-emitting area of two second sub-pixels 2 is smaller than the area of a first sub-pixel 1, and the total light-emitting area of two second sub-pixels 2 is smaller than the area of a third sub-pixel 3, because the green sub-pixels have higher light-emission efficiency than that of the sub-pixels in the other colors.

Optionally in the display substrate according to an embodiment of this disclosure, as illustrated in FIG. 7 to FIG. 12, when the second sub-pixels 2 in the second display sub-area A2 are green sub-pixels, a light-emitting area of a second sub-pixel 2 is smaller than a light-emitting area of a first sub-pixel 1, and a light-emitting area of a second sub-pixel is smaller than a light-emitting area of a third sub-pixel 3.

Figure 15:
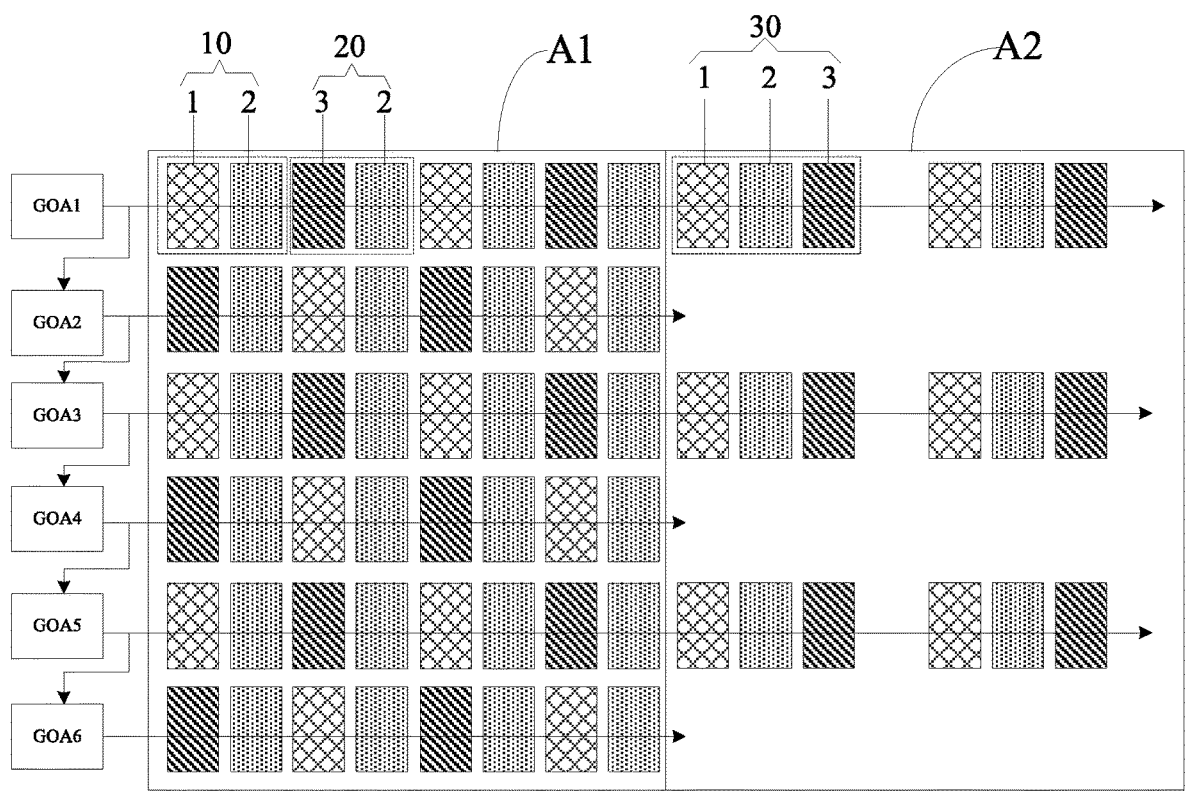
FIG. 15 is a demo diagram of the display substrate according to an embodiment of this disclosure, which is being scanned.

In a particular implementation, in the display substrate according to an embodiment of this disclosure, the display substrate according to an embodiment of this disclosure generally displays an image by scanning the first display sub-area row by row. As illustrated in FIG. 15, for example, when the first display sub-area A1 and the second display sub-area A2 are adjacent to each other in the row direction, gate driver circuits GOA1 to GOA5 output signals row by row, but only the GOA1, the GOA3, and the GOA5 output signals for the second display sub-area A2.

Based upon the same inventive idea, the embodiments of this disclosure further provides a display substrate, as illustrated in FIG. 1A to FIG. 11, a display area of the display substrate includes a first display sub-area A1 and a second display sub-area A2, where a distribution density of pixels in the first display sub-area A1 is higher than a distribution density of pixels in the second display sub-area A2. As illustrated in FIG. 3, the second display sub-area A2 includes a plurality of third pixel elements 30 (also referred to as pixel islands); each of the plurality of third pixel elements 30 includes multiple sub-pixels, and a distance between any two adjacent sub-pixels in the each third pixel element 30 is less than a distance between any two adjacent third pixel elements 30; and a light-emitting area of at least a part of the multiple sub-pixels in the second display sub-area A2 is greater than a light-emitting area of sub-pixels, with a same light-emitting color as the part of the multiple sub-pixels, in the first display sub-area A1.

In the display substrate according to the embodiment of this disclosure, the display area includes the first display sub-area A1 in which pixels are distributed at a high density (e.g., a high resolution), and the second display sub-area A2 in which pixels are distributed at a low density (e.g., a low resolution). Since the distribution density of pixels in the second display sub-area A2 is lower, a camera, sensor, earpiece and other elements can be arranged in the second display sub-display area, that is, the distribution density of the local pixels can be lowered to thereby improve the transmittivity of a screen so as to improve a screen to panel ratio of the display substrate. Moreover, by setting pixel islands in the second display sub-area A2 and increasing the light-emitting area of at least part of the sub-pixels in the second display sub-area A2, dark strip on the interface between the second display sub-area A2 and the first display sub-area A1 can be avoided, and the transmittivity of the second display sub-area A2 can be improved.

Figure 8:
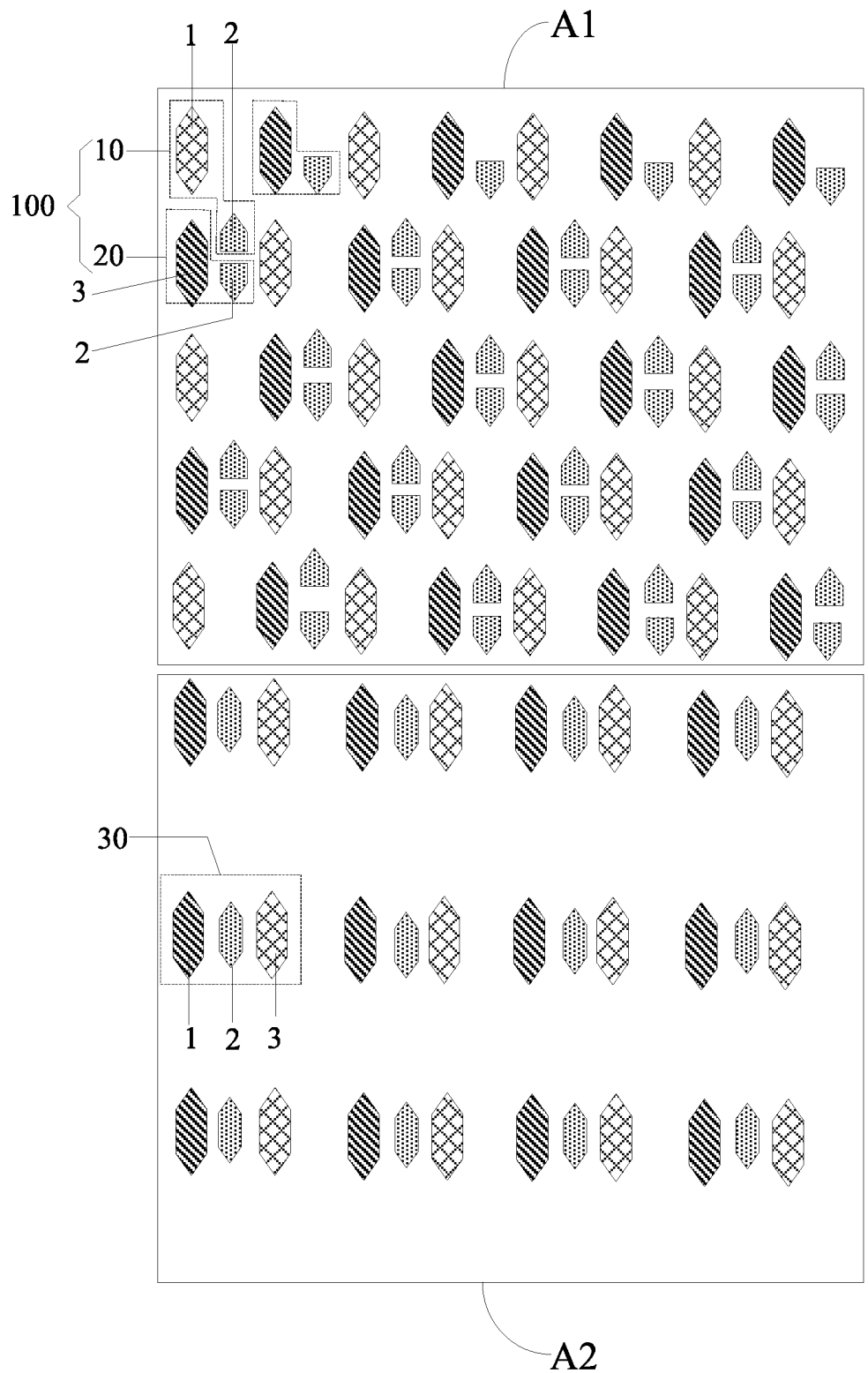
FIG. 8 is a seventh schematic structural diagram of a part of the display substrate according to an embodiment of this disclosure.

Optionally in the display substrate according to the embodiment of this disclosure, as illustrated in FIG. 7 and FIG. 8, the second display sub-area A2 includes multiple columns of sub-pixels, at least two columns of sub-pixels in the second display sub-area A2 are aligned with two corresponding columns of sub-pixels in the first display sub-area A1; and in a row direction, at least one column of sub-pixels in the first display sub-area A1 are arranged between two adjacent columns of sub-pixels in the second display sub-area A2, so as to ensure that the distribution density of pixels in the first display sub-area A1 is greater than the distribution density of pixels in the second display sub-area A2; where the row direction is perpendicular to a column direction. The meaning of "perpendicular" in this disclosure is that the included angle between the row direction and the column direction is 80° to 100°.

Optionally in the display substrate according to the embodiment of this disclosure, as illustrated in FIG. 2 to FIG. 5, the plurality of third pixel elements 30 in the second display sub-area A2 are arranged in parallel rows and columns; third pixel elements 30 arranged in adjacent rows are aligned, and third pixel elements 30 arranged in adjacent columns are aligned, so that the uniformity of light-emitting of the second display sub-area can be maintained.

Optionally in the display substrate according to the embodiment of this disclosure, as illustrated in FIG. 2 to FIG. 5, each of the plurality of third pixel elements 30 includes a first sub-pixel 1, a second sub-pixel 2 and a third sub-pixel 3; the second pixel 2 is arranged between the adjacent first sub-pixel 1 and third sub-pixel 2; and second sub-pixels 2 of third pixel elements 30 on a same column are arranged on a straight line. The second sub-pixel 2 can be a green sub-pixel, since the human eyes are most sensitive to green, such arrangement of sub-pixels can improve the uniformity of pixel distribution.

Optionally in the display substrate according to the embodiment of this disclosure, as illustrated in FIG. 5 to FIG. 10, among four closest sub-pixels in the second display sub-area A2, two second sub-pixels 2 of the four closest sub-pixels are arranged in middle, and a first sub-pixel 1 and a third pixel 3 of the four closest sub-pixels are arranged on two sides of the two second sub-pixels 3, and a center of each of the two second sub-pixels 2, a center of the first sub-pixel 1, and a center of the third sub-pixel 3 are connected to form a triangle, that is, lines connecting the centers of the first sub-pixel 1, each second sub-pixel 2, and the third sub-pixel 3 constitute a triangle, so that the formed triangle can avoid traverse bright and dark strips.

Optionally in the display substrate according to the embodiment of this disclosure, as illustrated in FIG. 2, FIGS. 4 to 6 and FIG. 12, among three adjacent columns of sub-pixels in the second display sub-area A2, a middle column of sub-pixels are second sub-pixels 2, and two columns of sub-pixels on two sides of the middle column of sub-pixels are first sub-pixels 1 and third sub-pixels 3, where the first sub-pixels 1 and the third sub-pixels 3 are alternately arranged; the first sub-pixels 1 and the third sub-pixels 3 of the two columns of sub-pixels can be arranged on a straight line to thereby avoid a color crosstalk from occurring in the column direction.

Optionally in the display substrate according to the embodiment of this disclosure, as illustrated in FIG. 3, the first display sub-area A1 includes first sub-pixels 1, second sub-pixels 2 and third sub-pixels 3; the first display sub-area A1 includes a plurality of second sub-pixel columns extending along a column direction, and sub-pixel columns arranged on an edge of the first display sub-area A1 are second sub-pixel columns; and sub-pixels, adjacent to the second sub-pixel columns arranged on the edge of the first display sub-area A1, in the second display sub-area A2 are the first sub-pixels 1 or the third sub-pixels 3, so as to ensure the normal light-emitting of the edge area between the first display sub-area A1 and the second display sub-area A2.

Optionally in the display substrate according to the embodiment of this disclosure, as illustrated in FIG. 7, in the second display sub-area A2, a light-emitting area of a second sub-pixel 2 is less than a light-emitting area of a third sub-pixel 3, and a size of a second sub-pixel 2 in the column direction is less than half of a size of a third sub-pixel 3 in the column direction. As such, the light-emitting efficiency of the second sub-pixel 2 can be improved.

Optionally in the display substrate according to the embodiment of this disclosure, as illustrated in FIG. 2, the first display sub-area A1 includes multiple columns of sub-pixels; a part of the multiple columns of sub-pixels are the second sub-pixels 2, and the remaining columns of the multiple columns of sub-pixels are the first sub-pixels 1 and the third sub-pixels 3 alternately arranged; the first sub-pixels 1 and the third sub-pixels 3 are arranged on a straight line, so that the uniformity of light-emitting of the first display sub-area A1 can be maintained.

Figure 9:
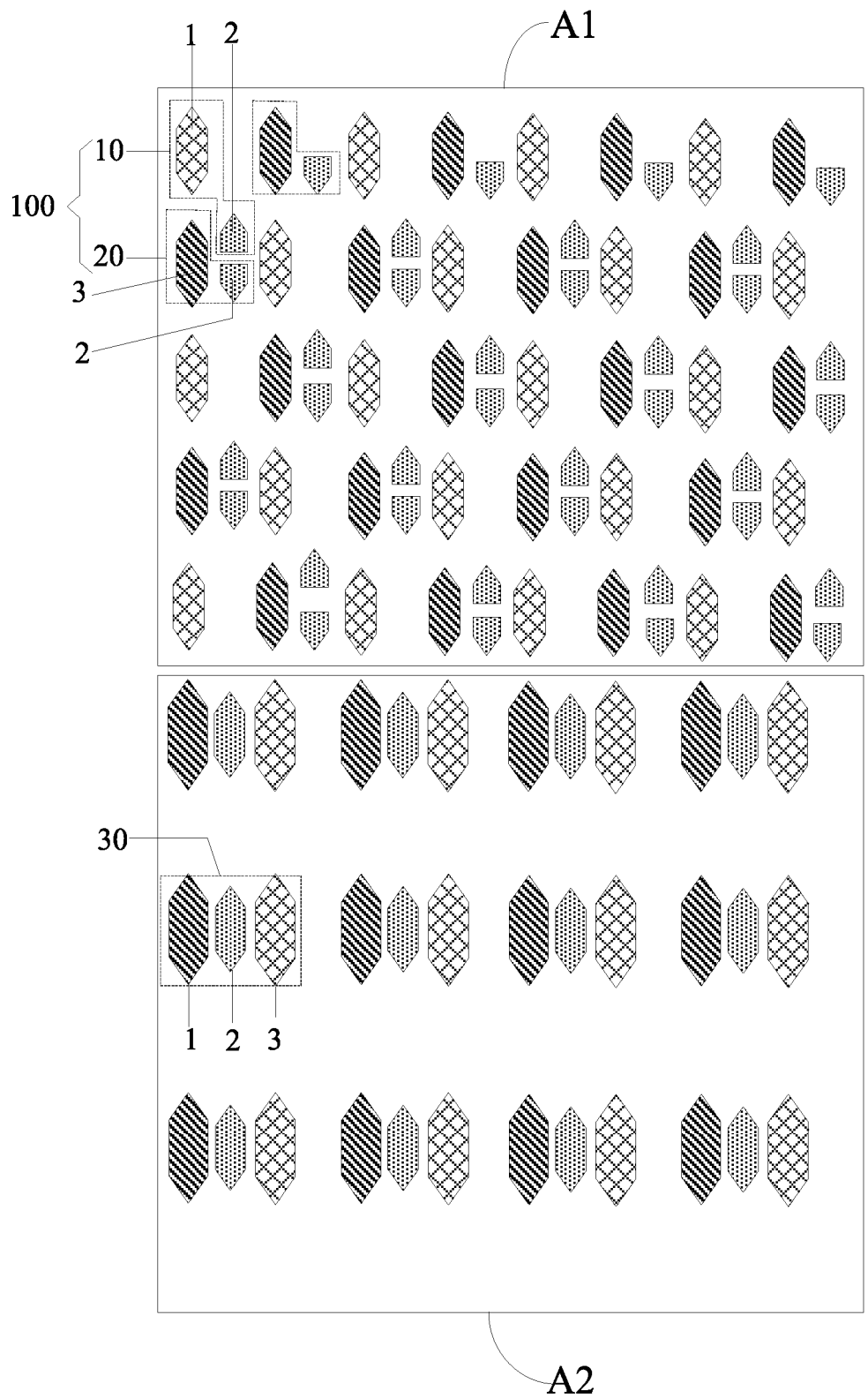
FIG. 9 is an eighth schematic structural diagram of a part of the display substrate according to an embodiment of this disclosure.

Optionally in the display substrate according to the embodiment of this disclosure, as illustrated in FIG. 9, at least one sub-pixel has different shapes in the first display sub-area A1 and the second display sub-area A2, so that diffraction problems can be avoided in the second display sub-area A2.

Optionally in the display substrate according to the embodiment of this disclosure, as illustrated in FIG. 5, in the first display sub-area A1, a quantity of the second sub-pixels 2 is greater than a quantity of the first sub-pixels 1 or a quantity of the third sub-pixels 3; in a sub-pixel column where the first sub-pixels 1 and the third sub-pixels 3 are alternately arranged, adjacent first sub-pixel 1 and third sub-pixel 3 form a triangle with a second sub-pixel 2 of an adjacent column on left or right of the sub-pixel column, respectively. As such, the formed triangle can avoid traverse bright and dark strips.

Optionally in the display substrate according to the embodiment of this disclosure, as illustrated in FIG. 5, in the first display sub-area A1, a distance between centers of any two adjacent sub-pixels in a sub-pixel column is identical; and a distance between centers of any two adjacent sub-pixels in a sub-pixel row is identical, which can ensure uniform light emitting.

Optionally in the display substrate according to the embodiment of this disclosure, as illustrated in FIG. 6, multiple sub-pixel rows of the first display sub-area A1 each includes alternately arranged first sub-pixels 1 and third sub-pixels 3; in two adjacent sub-pixel rows of the multiple sub-pixel rows, first sub-pixels 1 and third sub-pixels 3 of one row of the two adjacent sub-pixel rows are arranged in a staggered arrangement with first sub-pixels 1 and third sub-pixels 3 of other row of the two adjacent sub-pixel rows; and the first sub-pixels 1 and the third sub-pixels 3 are arranged on a straight line in the row direction. So that the light emitting of the first display sub-area A1 can be guaranteed to be uniform.

Optionally in the display substrate according to the embodiment of this disclosure, as illustrated in FIG. 2, the second display sub-area A1 includes multiple rows of third pixel elements 30; in a row of third pixel elements 30, a straight line in the row direction passes through two adjacent third pixel elements 30; and two sub-pixels respectively arranged on two adjacent edges of the two adjacent third pixel elements 30 are arranged on the straight line; and light-emitting colors of the two sub-pixels are different, so that bright lines can be avoided.

Optionally in the display substrate according to the embodiment of this disclosure, the first sub-pixel 1 emits blue light, i.e., the first sub-pixel 1 is blue sub-pixel; the second sub-pixel 2 emits green light, i.e., the second sub-pixel 2 is green sub-pixel; and the third sub-pixel 3 emits red light, i.e., the third sub-pixel 3 is a red sub-pixel.

Based upon the same inventive idea, the embodiments of this disclosure further provides a display substrate, as illustrated in FIG. 1A to FIG. 1I, a display area of the display substrate includes a first display sub-area A1 and a second display sub-area A2, where a distribution density of pixels in the first display sub-area A1 is higher than a distribution density of pixels in the second display sub-area A2. As illustrated in FIG. 8, both the first display sub-area A1 and the second display sub-area A2 include multiple columns of sub-pixels parallel to each other, and a column of sub pixels in the first display sub-area A1 are aligned with a corresponding column of sub pixels in second display sub-area A2; and a light-emitting area of at least a part of the multiple sub-pixels in the second display sub-area A2 is greater than a light-emitting area of sub-pixels, with a same light-emitting color as the part of the multiple sub-pixels, in the first display sub-area A1.

In the display substrate according to the embodiment of this disclosure, the display area includes the first display sub-area A1 in which pixels are distributed at a high density (e.g., a high resolution), and the second display sub-area A2 in which pixels are distributed at a low density (e.g., a low resolution). Since the distribution density of pixels in the second display sub-area A2 is lower, a camera, sensor, earpiece and other elements can be arranged in the second display sub-display area, that is, the distribution density of the local pixels can be lowered to thereby improve the transmittivity of a screen so as to improve a screen to panel ratio of the display substrate. Moreover, by increasing the light-emitting area of at least part of the sub-pixels in the second display sub-area A2, dark strip on the interface between the second display sub-area A2 and the first display sub-area A1 can be avoided; and by aligning a column of sub pixels in the first display sub-area A1 with a corresponding column of sub pixels in the second display sub-area A2, the uniformity of light-emitting of the first display sub-area A1 and the second display sub-area A2 can be improved.

Optionally in the display substrate according to the embodiment of this disclosure, as illustrated in FIG. 5, the second display sub-area A2 includes first sub-pixels 1, second sub-pixels 2 and third sub-pixels 3; in the second display sub-area A2; and a center of a first sub-pixel 1, a center of a second sub-pixel 2 and a center of a third sub-pixel 3 are connected to form an isosceles triangle, where the first sub-pixel 1, the second sub-pixel 2 and the third sub-pixel 3 are adjacent to each other. That is, lines connecting the centers of the first sub-pixel 1, the second sub-pixel 2 and the third sub-pixel 3 constitute a triangle, thereby avoiding traverse bright and dark strips from occurring in the second display sub-area.

Optionally in the display substrate according to the embodiment of this disclosure, as illustrated in FIG. 10, in the second display sub-area A2, two first sub-pixels 1 and two third sub-pixels 3 adjacent to each other form a rectangle, and a second sub-pixel 2 is arranged in a center of the rectangle, so that the uniformity of the light emitting of the second display sub-area A2 can be improved.

Figure 11:
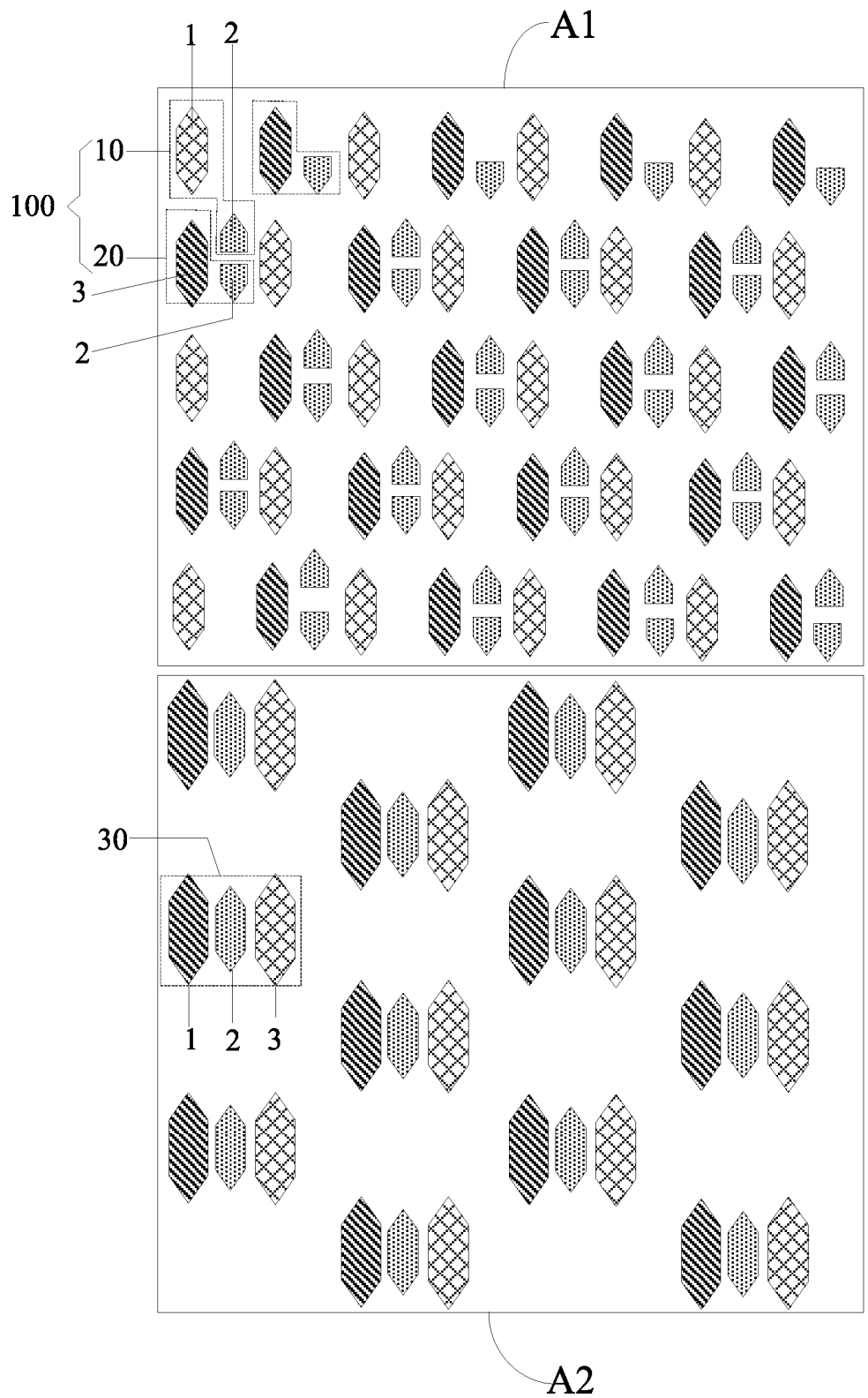
FIG. 11 is a tenth schematic structural diagram of a part of the display substrate according to an embodiment of this disclosure.

Optionally in the display substrate according to the embodiment of this disclosure, as illustrated in FIG. 11, the second sub-pixels 2 in the second display sub-area A2 are arranged in multiple rows, the second sub-pixels 2 in two adjacent rows of second sub-pixels are staggered. The second sub-pixel 2 can be a green sub-pixel, since the human eyes are most sensitive to green, such arrangement of sub-pixels can improve the uniformity of pixel distribution.

Optionally in the display substrate according to the embodiment of this disclosure, as illustrated in FIG. 7, the second display sub-area A2 includes multiple columns of sub-pixels extending along the column direction; and in the columns direction, there is at least one sub-pixel column of the first display sub-area A1 between at least two adjacent sub-pixel columns in the second display sub-area A2, thereby reducing the pixel density and improving the transmittance.

Optionally in the display substrate according to the embodiment of this disclosure, as illustrated in FIG. 3, the first display sub-area A1 includes first sub-pixels 1, second sub-pixels 2 and third sub-pixels 3; and the first display sub-area A1 includes multiple columns of second sub-pixels extending along the column direction, and a sub-pixel row at the edge of the first display sub-area A1 is a second sub-pixel row.

Optionally in the display substrate according to the embodiment of this disclosure, the sub-pixels adjacent to the second sub-pixel column at the edge of the first display sub-area A1 are first sub-pixels 1 and third sub-pixels 3; and among the sub-pixels adjacent to the second sub-pixel column, a part of the sub-pixels arranged in the first display sub-area A1 have the same color, and the remaining part of the sub-pixels arranged in the second display sub-area A2 have the same color, so as to ensure the normal light emitting of the edge region.

Optionally in the display substrate according to the embodiment of this disclosure, as illustrated in FIG. 2 to FIG. 6, in the first display sub-area A1, a second sub-pixel 2 can form a triangle with an adjacent first sub-pixel 1 and an adjacent third sub-pixel 3, the adjacent first sub-pixel 1 and the adjacent third sub-pixel 3 can arranged at one side of a row where the second sub-pixel 2 is located, or the adjacent first sub-pixel 1 and the adjacent third sub-pixel 3 can arranged at the other side of the row where the second sub-pixel 2 is located, so that the resolution of the first display sub-area A1 can be improved.

Optionally in the display substrate according to the embodiment of this disclosure, as illustrated in FIG. 10, in the second display sub-area A2, the first sub-pixel 1 and the third sub-pixel 3 closest to a row of second sub-pixels 2 are alternately arranged along the row direction, which can ensure uniform of the light emitting.

Optionally in the display substrate according to the embodiment of this disclosure, in the first display sub-area A1, first sub-pixels 1 in one sub-pixel row are aligned with third sub-pixels 3 in another sub-pixel row adjacent to the one sub-pixel row, thereby ensuring an uniformly distribution of pixels.

Optionally in the display substrate according to the embodiment of this disclosure, as illustrated in FIG. 7, at least one sub-pixel in the second display sub-area A2 and at least one sub-pixel in the first display sub-area A1 with the same color as the at least one sub-pixel in the second display sub-area A2 have effective light-emitting regions with different shapes. That is, shapes of the effective light-emitting region of sub-pixels in the first display sub-area A1 can be different from shapes of the effective light-emitting region of sub-pixels, with a same color as the sub-pixels in the first display sub-area A1, in the second display sub-area A2, thereby reducing diffraction.

Optionally in the display substrate according to the embodiment of this disclosure, the first sub-pixel 1 emits blue light, i.e., the first sub-pixel 1 is blue sub-pixel; the second sub-pixel 2 emits green light, i.e., the second sub-pixel 2 is green sub-pixel; and the third sub-pixel 3 emits red light, i.e., the third sub-pixel 3 is a red sub-pixel.

Figure 14:
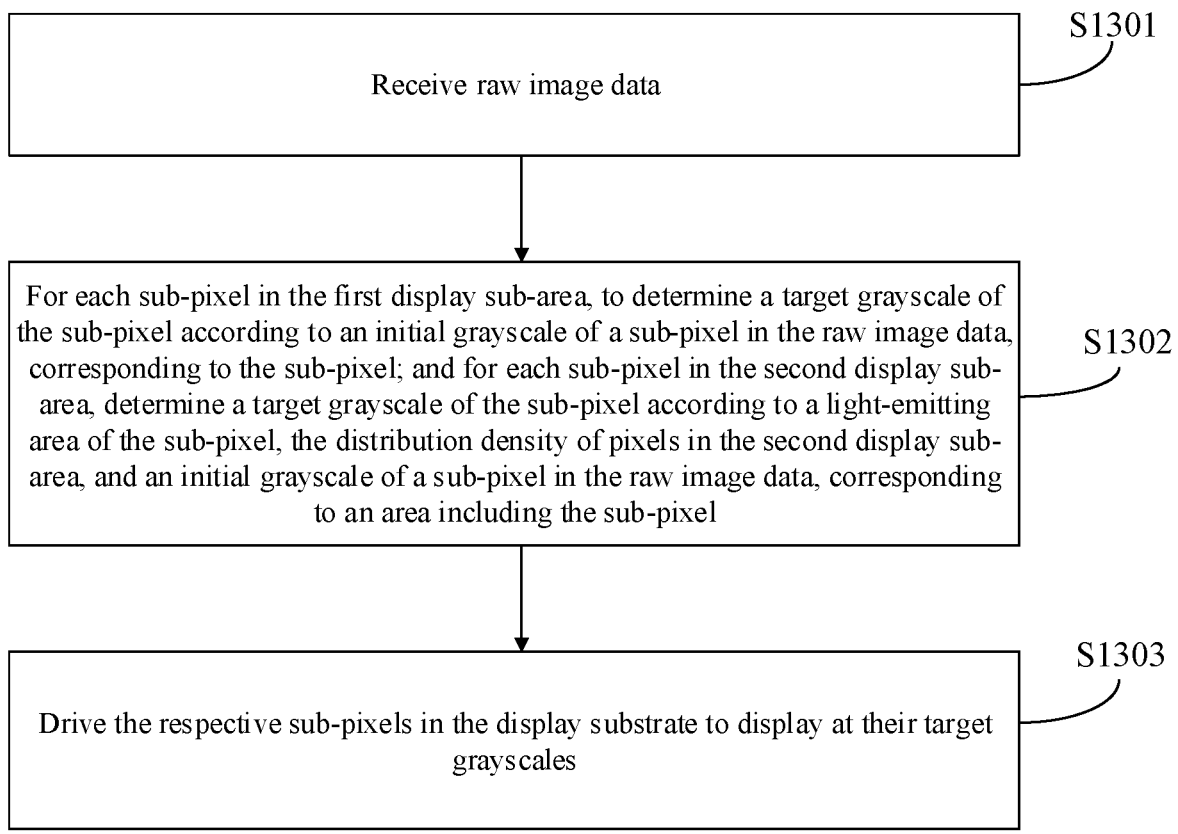
FIG. 14 is a schematic flow chart of a method for driving the display substrate according to an embodiment of this disclosure.

Based upon the same inventive idea, an embodiment of this disclosure further provides a method for driving the display substrate according to any one of an embodiments above of this disclosure, and as illustrated in FIG. 14, the method includes the following steps:

the step S1301 is to receive raw image data;

the step S1302 is, for each sub-pixel in the first display sub-area, to determine a target grayscale of the sub-pixel according to an initial grayscale of a sub-pixel in the raw image data, corresponding to the sub-pixel; and for each sub-pixel in the second display sub-area, to determine a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and the step S1303 is to drive the respective sub-pixels in the display substrate to display at their target grayscales.

For a sub-pixel in the first display sub-area, when a physical pixel in the first display sub-area corresponds to a pixel in the image data, a target grayscale of the sub-pixel is generally an initial grayscale thereof; and when the number of physical pixels in the first display sub-area is less than the number of pixels in the image data, there is a borrowing relationship between displaying sub-pixels, so a sub-pixel may correspond to two or more pixels in the image data, and thus the garget grayscale of the sub-pixel shall be calculated according to the initial grayscale of the sub-pixel in the raw image data, corresponding thereto.

For each sub-pixel in the second display sub-area, there is a low resolution, and in order to display an image, a physical pixel corresponds to a pixel in the image data, and a target grayscale of the sub-pixel is generally an initial grayscale thereof. However there may be such a problem there is a low resolution of the second display sub-area, and if the image is displayed directly at the initial grayscale, then there will be such a large difference in brightness between the second display sub-area and the first display sub-area that there may be an apparent dark strip at the interface between the second display sub-area and the first display sub-area. In order to address this problem, a driver according to this embodiment of this disclosure adjusts the grayscale of the sub-pixel in the second display sub-area according to a light-emitting area of the sub-pixel, and the distribution density of pixels in the second display sub-area. For example, if there is a larger light-emitting area of the sub-pixel, there is high overall brightness in the second display sub-area, and there are a larger number of sub-pixels distributed in the second display sub-area, then there will be high overall brightness in the second display sub-area.

It shall be noted that a physical pixel generally includes three RGB sub-pixels.

In a particular implementation, when the pixels are arranged in a pan tile pattern in the first display sub-area, both the first sub-pixels and the third sub-pixels are borrowed for displaying an image, so a first sub-pixel generally corresponds to two pixels in the image data, a third sub-pixel corresponds to two pixels in the image data, and no second sub-pixel is borrowed, and thus a second sub-pixel generally corresponds to a pixel in the image data.

Accordingly optionally in the method according to an embodiment of this disclosure, determining for each sub-pixel in the first display sub-area the target grayscale of the sub-pixel particularly can include:

determining a target grayscale X corresponding to a first sub-pixel in the equation of $$X = \left(\frac{x_1^{Gamma} + x_2^{Gamma}}{2}\right)^{\frac{1}{Gamma}},$$

where Gamma represents a gamma value of the display substrate, and $x_1$ and $x_2$ represent initial grayscales of two first sub-pixels in the raw image data, which correspond to the first sub-pixel respectively;

determining a target grayscale Y of a second sub-pixel as an initial grayscale y of a second sub-pixel in the raw image data, corresponding to the second sub-pixel; and determining a target grayscale Z corresponding to a third sub-pixel in the equation of $$Z = \left(\frac{z_1^{Gamma} + z_2^{Gamma}}{2}\right)^{\frac{1}{Gamma}},$$

where $z_2$ represent initial grayscales of two third sub-pixels in the raw image data, which correspond to the third sub-pixel respectively.

In a particular implementation, in order to alleviate a dark strip at the interface between the second display sub-area and the first display sub-area, brightness in the second display sub-area can be adjusted as appropriate, where the brightness is in proportion to a light-emitting area and the distribution density of pixels.

Accordingly optionally in the method according to an embodiment of this disclosure, determining for each sub-pixel in the second display sub-area the target grayscale of the sub-pixel particularly can include:

determining the target grayscale X corresponding to the sub-pixel in the equation of $$X = k*s*\rho\left(\frac{x_1^{Gamma} + x_2^{Gamma} + \ldots + x_n^{Gamma}}{n}\right)^{\frac{1}{Gamma}},$$

where n is any integer ranging from 1 to N, N is the number of sub-pixels in the raw image data, which correspond to the sub-pixel, Gamma represents a gamma value of the display substrate, s represents the ratio of a light-emitting area of a sub-pixel in the first display sub-area to a light-emitting area of a sub-pixel in the second display sub-area, ρ represents the ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

In a particular implementation, the error adjustment coefficient k can be adjusted according to a real display effect of the display substrate, although an embodiment of this disclosure will not be limited thereto.

In a particular implementation, if there are m third pixel elements in a unit of area in the second display sub-area, and there are j pixels in the image data in the corresponding area, then there will be j/m pixels in image data corresponding to a third pixel element, that is, N=j/m. A target grayscale of a sub-pixel can be determined according to any one or more of N sub-pixels corresponding thereto. For example, with N=4, a target grayscale of a sub-pixel can be determined according to initial grayscales of any one or more of four sub-pixels in image data corresponding thereto. For example, if it is determined according to an initial grayscale of one of the sub-pixels, then $X=k*s*\rho*x_1$, where $x_1$ represents an initial grayscale of any one of the four sub-pixels. For example, if it is determined according to initial grayscales of two of the sub-pixels, then $$X = k*s*\rho\left(\frac{x_1^{Gamma} + x_2^{Gamma}}{2}\right)^{\frac{1}{Gamma}},$$

where $x_1$ and $x_2$ represent initial grayscales of any two of the four sub-pixels. For example, if it is determined according to initial grayscales of three of the sub-pixels, then $$X = k*s*\rho\left(\frac{x_1^{Gamma} + x_2^{Gamma} + x_3^{Gamma}}{3}\right)^{\frac{1}{Gamma}},$$

where $x_1$, $x_2$, and $x_3$ represent initial grayscales of any three of the four sub-pixels. For example, if it is determined according to initial grayscales of the sub-pixels, then $$X = k*s*\rho\left(\frac{x_1^{Gamma} + x_2^{Gamma} + x_3^{Gamma} + x_4^{Gamma}}{4}\right)^{\frac{1}{Gamma}},$$

where $x_1$, $x_2$, $x_3$, and $x_4$ represent initial grayscales of the four sub-pixels.

Based upon the same inventive idea, an embodiment of this disclosure further provides a display device including the display substrate according to any one of the embodiments above of this disclosure. The display device can be a mobile phone, a tablet computer, a TV set, a monitor, a notebook computer, a digital photo frame, a navigator, or any other product or component with a display function. Reference can be made to an embodiment of the display substrate above for an implementation of the display device, and a repeated description thereof will be omitted here.

Optionally the display device according to an embodiment of this disclosure further includes a driver configured to drive the display substrate, where the driver of the display substrate can be an Integrated Circuit (IC), an external Central Processing Unit (CPU), a micro processor, etc., and is configured:

to receive raw image data;

for each sub-pixel in the first display sub-area, to determine a target grayscale of the sub-pixel according to an initial grayscale of a sub-pixel in the raw image data, corresponding to the sub-pixel;

for each sub-pixel in the second display sub-area, to determine a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and to drive the respective sub-pixels in the display substrate to display at their target grayscales.

Optionally in the display device according to an embodiment of this disclosure, the driver is configured to determine for each sub-pixel in the first display sub-area the target grayscale of the sub-pixel by:

determining a target grayscale X corresponding to a first sub-pixel in the first display sub-area in the equation of $$X = \left(\frac{x_1^{Gamma} + x_2^{Gamma}}{2}\right)^{\frac{1}{Gamma}},$$

where Gamma represents a gamma value of the display substrate, which is generally 2.2, and $x_1$ and $x_2$ represent initial grayscales of two first sub-pixels in the raw image data, which correspond to the first sub-pixel respectively;

determining a target grayscale Y of a second sub-pixel in the first display sub-area as an initial grayscale y of a second sub-pixel in the raw image data, corresponding to the second sub-pixel; and determining a target grayscale Z corresponding to a third sub-pixel in the first display sub-area in the equation of $$Z = \left(\frac{z_1^{Gamma} + z_2^{Gamma}}{2}\right)^{\frac{1}{Gamma}},$$

where $z_1$ and $z_2$ represent initial grayscales of two third sub-pixels in the raw image data, which correspond to the third sub-pixel respectively.

In a particular implementation, in order to alleviate a dark strip at the interface between the second display sub-area and the first display sub-area, brightness in the second display sub-area can be adjusted as appropriate, where the brightness is in proportion to a light-emitting area and the distribution density of pixels.

Accordingly optionally in the display device according to an embodiment of this disclosure, the driver is configured to determine for each sub-pixel in the second display sub-area the target grayscale of the sub-pixel by:

determining the target grayscale X corresponding to the sub-pixel in the equation of $$X = k*s*\rho\left(\frac{x_1^{Gamma} + x_2^{Gamma} + \ldots + x_n^{Gamma}}{n}\right)^{\frac{1}{Gamma}},$$

where n is any integer ranging from 1 to N, N is the number of sub-pixels in the raw image data, which correspond to the sub-pixel, Gamma represents a gamma value of the display substrate, s represents the ratio of a light-emitting area of a sub-pixel in the first display sub-area to a light-emitting area of a sub-pixel in the second display sub-area, ρ represents the ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

In a particular implementation, the error adjustment coefficient k can be adjusted according to a real display effect of the display substrate, although an embodiment of this disclosure will not be limited thereto.

A reference can be made to the implementation of the driver in the display device above for details of the method according to an embodiment of this disclosure.

In a particular implementation, in the display device according to an embodiment of this disclosure, the driver integrates all the algorithms for calculating the target grayscales of the sub-pixels in the respective sub-areas into an IC. In order to display an image, the driver determines the target grayscales corresponding to the respective sub-pixels according to the received image data.

Furthermore before the display substrates displays at the target grayscales, in order to improve the uniformity of brightness, generally a Demura algorithm shall also be performed. A particular Demura algorithm is known in the art, so a repeated description thereof will be omitted here.

Based upon the same inventive idea, an embodiment of this disclosure further provides a fine metal mask for fabricating the display substrate according to any one of an embodiments of this disclosure, where the fine metal mask includes a plurality of opening areas corresponding in shape and position to the first sub-pixels, the second sub-pixels, or the third sub-pixels.

Figure 12:
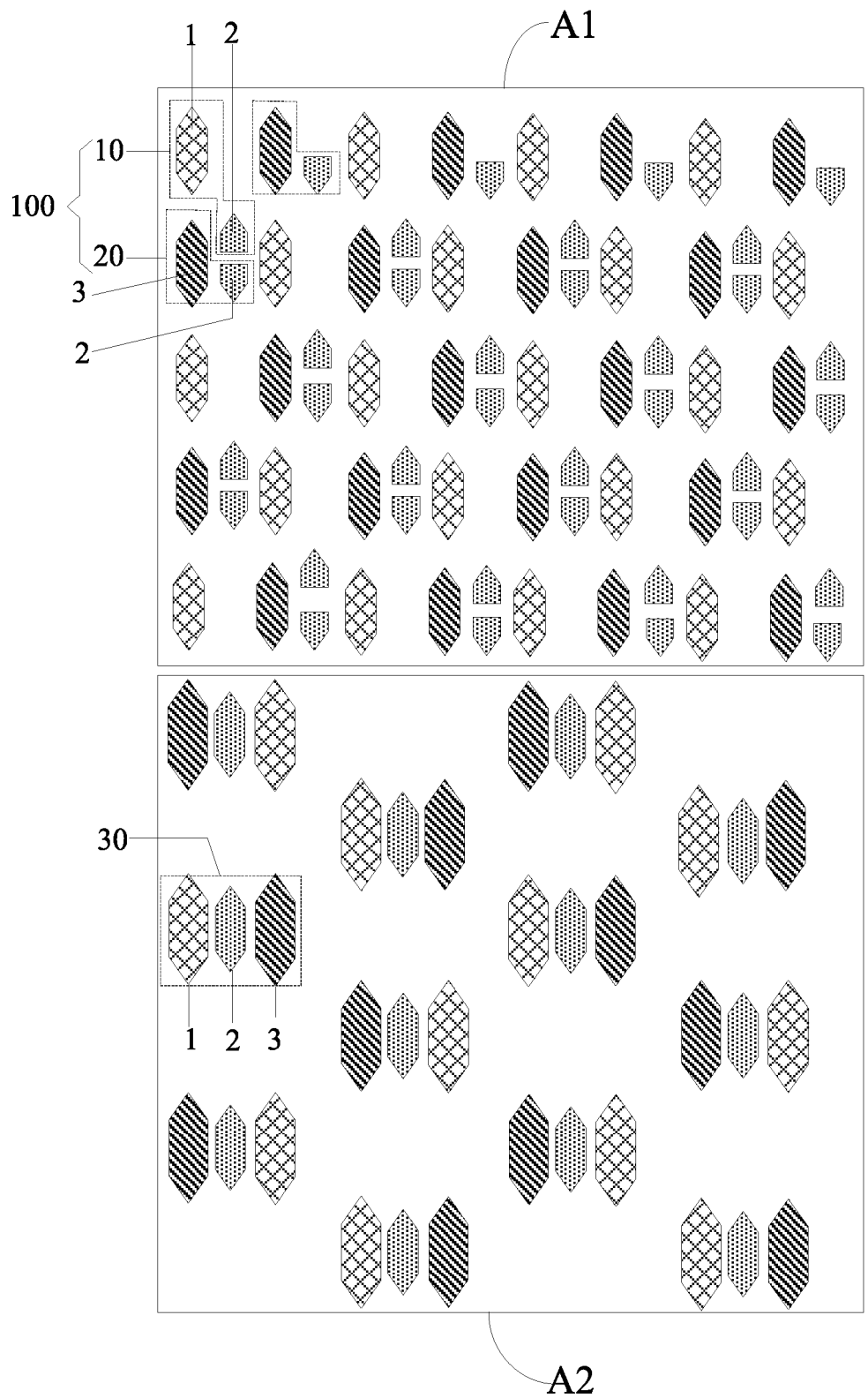
FIG. 12 is an eleventh schematic structural diagram of a part of the display substrate according to an embodiment of this disclosure.
Figure 16:
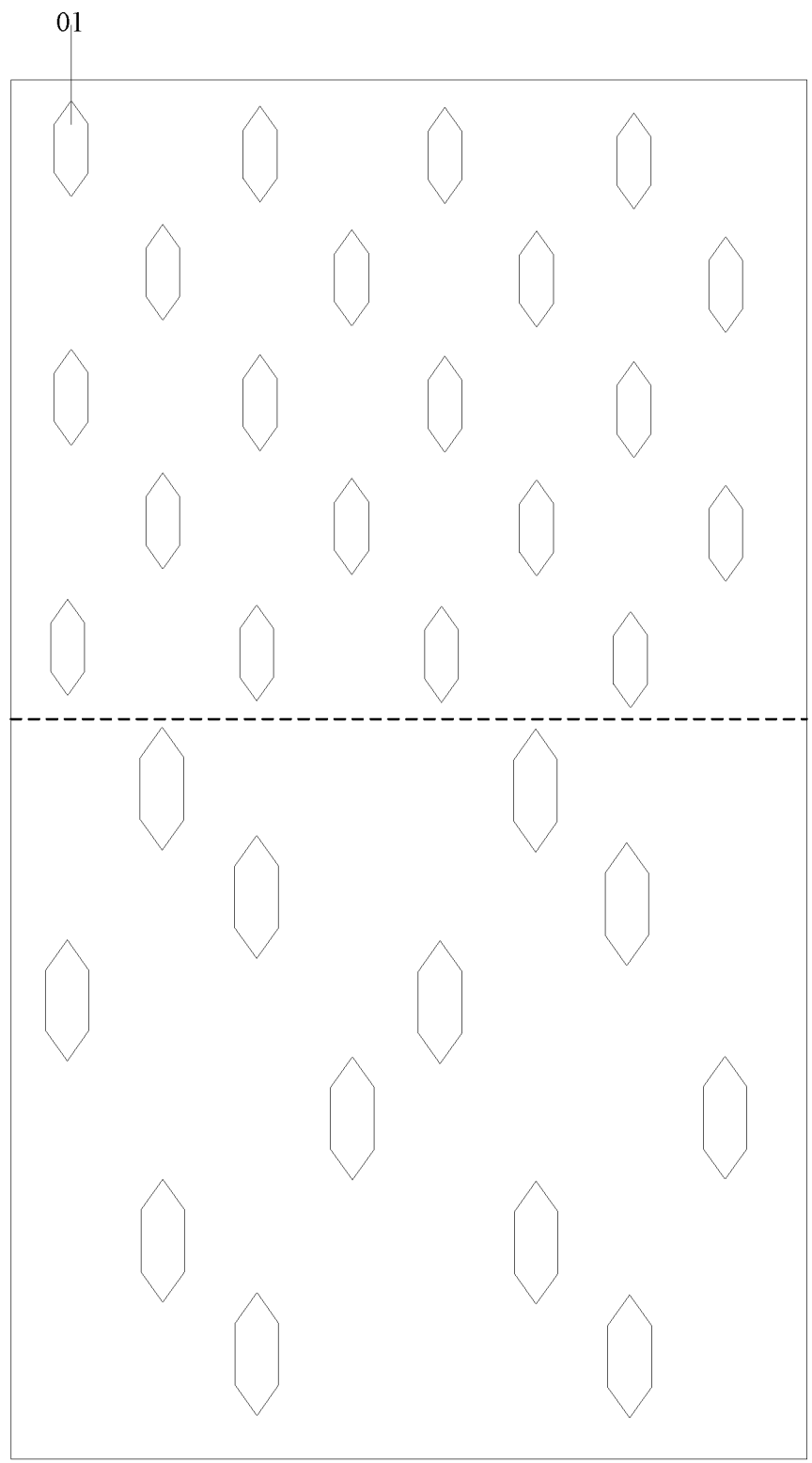
FIG. 16 is a schematic structural diagram of a fine metal mask according to an embodiment of this disclosure.

In a particular implementation, each sub-pixel generally includes an anode layer, a light-emitting layer, and a cathode layer, where the light-emitting layer is generally vapor-plated using the fine metal mask above. Taking the display substrate as illustrated in FIG. 12 as an example, the fine metal mask for forming the first sub-pixels includes opening areas 01 corresponding in shape and position to the light-emitting layers of the first substrate 1 in the display substrate as illustrated in FIG. 16. The area of an opening area 01 is generally larger than an area of a corresponding light-emitting area due to a limiting process factor. Principles of fine metal mask for forming the second sub-pixels, and the fine metal mask for forming the third sub-pixels are similar to the principle of the fine metal mask for forming the first sub-pixels, so a repeated description thereof will be omitted here.

In the display substrate, the method for driving the same, the display device, and the fine metal mask above according to the embodiments of this disclosure, the display area includes the first display sub-area with a high distribution density of pixels (i.e., a high resolution), and the second display sub-area with a low distribution density of pixels (i.e., a low resolution), and since the distribution density of pixels in the second display sub-area is low, a camera and another element can be arranged in the second display sub-area, that is, the distribution density of the local pixels can be lowered to thereby improve the transmittivity of a screen so as to improve a screen to panel ratio of the display substrate. Furthermore in order to drive the display substrate, the grayscale of a sub-pixel in the second display sub-area can be adjusted according to the light-emitting area of the sub-pixel, and the distribution density of pixels, in the second display sub-area to thereby compensate for a significant difference in brightness between the second display sub-area and the first display sub-area due to the difference between the distribution density of pixels in the first display sub-area, and the distribution density of pixels in the second display sub-area so as to alleviate a dark strip from occurring at the interface between the first display sub-area and the second display sub-area, so that the image can be displayed throughout the screen.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display substrate, comprising a display area comprising a first display sub-area and a second display sub-area, wherein:
   a distribution density of pixels in the first display sub-area is greater than a distribution density of pixels in the second display sub-area;
   the first display sub-area comprises a plurality of first pixel elements and a plurality of second pixel elements;
   the second display sub-area comprises a plurality of third pixel elements, wherein each of the plurality of third pixel elements comprises multiple sub-pixels, and a distance between any two adjacent sub-pixels in the each third pixel element is less than a distance between any two adjacent third pixel elements; and
   the first display sub-area is a normal display area, the second display sub-area is an under-screen camera display area with a camera, and a light-emitting area of a sub-pixel in the under-screen camera display area is greater than a light-emitting area of a sub-pixel, with a same light-emitting color as the sub-pixel in the under-screen camera display area, in the normal display area;
   wherein the each third pixel element comprises a first sub-pixel, a second sub-pixel and a third sub-pixel; and second sub-pixels of third pixel elements on a same column are arranged on a straight line, a distance between any two adjacent second sub-pixels in the same column is the same, a distance between any two adjacent second sub-pixels in a same row is the same, a size of the second sub-pixel is less than a size of the third sub-pixel, and the first sub-pixel, the second sub-pixel and the third sub-pixel all have edges parallel to a column direction or a row direction;
   wherein in the second display sub-area, two adjacent columns of third pixel elements are misaligned, two adjacent rows of third pixel elements are misaligned, and first sub-pixels, second sub-pixels and third sub-pixels in two third pixel elements adjacent in the column direction are arranged in a same order and in a same arrangement;
   wherein in the first display sub-area, two adjacent first pixel elements each comprises a first sub-pixel and a second sub-pixel in a same arrangement, two adjacent second pixel elements each comprises a second sub-pixel and a third sub-pixel in a same arrangement, two adjacent columns of first pixel elements are misaligned and two adjacent columns of second pixel elements are misaligned; and
   wherein a line connecting centers of two sub-pixels in each of the first pixel elements is not parallel to the row direction and not parallel to the column direction, and a line connecting centers of two sub-pixels in each of the second pixel elements is not parallel to the row direction and not parallel to the column direction.

2. The display substrate according to claim 1, wherein the second display sub-area comprises multiple columns of sub-pixels, at least two columns of sub-pixels in the second display sub-area are aligned with two corresponding columns of sub-pixels in the first display sub-area;
in the row direction, at least one column of sub-pixels in the first display sub-area are arranged between two adjacent columns of sub-pixels in the second display sub-area, wherein the row direction is perpendicular to the column direction.

3. The display substrate according to claim 1, wherein the plurality of third pixel elements in the second display sub-area are arranged in parallel rows and columns.

4. The display substrate according to claim 1, wherein among four closest sub-pixels in the second display sub-area,
two second sub-pixels of the four closest sub-pixels are arranged in middle, and a first sub-pixel and a third sub-pixel of the four closest sub-pixels are arranged on two sides of the two second sub-pixels, and
a center of each of the two second sub-pixels, a center of the first sub-pixel, and a center of the third sub-pixel are connected to form a triangle.

5. The display substrate according to claim 1, wherein among three adjacent columns of sub-pixels in the second display sub-area,
a middle column of sub-pixels are second sub-pixels, and two columns of sub-pixels on two sides of the middle column of sub-pixels are first sub-pixels and third sub-pixels, wherein the first sub-pixels and the third sub-pixels are alternately arranged;
wherein the first sub-pixels and the third sub-pixels of the two columns of sub-pixels are arranged on a straight line in a row direction.

6. The display substrate according to claim 1, wherein:
in the second display sub-area, a light-emitting area of a second sub-pixel is less than a light-emitting area of a third sub-pixel, and a size of a second sub-pixel in the column direction is less than half of a size of a third sub-pixel in the column direction.

7. The display substrate according to claim 1, wherein the first display sub-area comprises multiple columns of sub-pixels;
a part of the multiple columns of sub-pixels are columns of second sub-pixels, and the remaining columns of the multiple columns of sub-pixels are columns alternately arranged with first sub-pixels and third sub-pixels, wherein the first sub-pixels and the third sub-pixels are arranged on a straight line in a row direction.

8. The display substrate according to claim 7, wherein:
in the first display sub-area, a quantity of the second sub-pixels is greater than a quantity of the first sub-pixels or a quantity of the third sub-pixels;
in a sub-pixel column where the first sub-pixels and the third sub-pixels are alternately arranged, adjacent first sub-pixel and third sub-pixel form a triangle with a second sub-pixel of an adjacent column on left or right of the sub-pixel column, respectively.

9. The display substrate according to claim 1, wherein, at least one sub-pixel has different shapes in the first display sub-area and the second display sub-area.

10. The display substrate according to claim 1, wherein, in the first display sub-area, a distance between centers of any two adjacent sub-pixels in a sub-pixel column is identical; and a distance between centers of any two adjacent sub-pixels in a sub-pixel row is identical.

11. The display substrate according to claim 1, wherein:
multiple sub-pixel rows of the first display sub-area each comprises alternately arranged first sub-pixels and third sub-pixels, wherein in two adjacent sub-pixel rows of the multiple sub-pixel rows, first sub-pixels and third sub-pixels of one row of the two adjacent sub-pixel rows are arranged in a staggered arrangement with first sub-pixels and third sub-pixels of other row of the two adjacent sub-pixel rows, and the first sub-pixels and the third sub-pixels are arranged on a straight line in the row direction.

12. The display substrate according to claim 1, wherein, the second display sub-area comprises multiple rows of third pixel elements;
in a row of third pixel elements, a straight line in the row direction passes through two adjacent third pixel elements; and
two sub-pixels respectively arranged on two adjacent edges of the two adjacent third pixel elements are arranged on the straight line, wherein light-emitting colors of the two sub-pixels are different.

13. The display substrate according to claim 1, wherein the first sub-pixel emits blue light, the second sub-pixel emits green light and the third sub-pixel emits red light.

14. A display device, comprising the display substrate according to claim 1.

15. A display substrate, comprising a display area comprising a first display sub-area and a second display sub-area, wherein:
a distribution density of pixels in the first display sub-area is greater than a distribution density of pixels in the second display sub-area;
both the first display sub-area and the second display sub-area comprise multiple columns of sub-pixels parallel to each other, and a column of sub-pixels in the first display sub-area is aligned with a corresponding column of sub-pixels in second display sub-area;
a light-emitting area of at least a part of the multiple sub-pixels in the second display sub-area is greater than a light-emitting area of sub-pixels, with a same light-emitting color as the part of the multiple sub-pixels, in the first display sub-area; and
wherein the second sub-pixels in the second display sub-area are arranged in multiple rows, the second sub-pixels in two adjacent rows of second sub-pixels are staggered;
wherein the first display sub-area comprises a plurality of first pixel elements and a plurality of second pixel elements;
wherein in the first display sub-area, two adjacent first pixel elements each comprises a first sub-pixel and a second sub-pixel in a same arrangement, two adjacent second pixel elements each comprises a second sub-pixel and a third sub-pixel in a same arrangement, two adjacent columns of first pixel elements are misaligned and two adjacent columns of second pixel elements are misaligned; and
wherein a line connecting centers of two sub-pixels in each of the first pixel elements is not parallel to the row direction and not parallel to the column direction, and a line connecting centers of two sub-pixels in each of the second pixel elements is not parallel to the row direction and not parallel to the column direction.

16. The display substrate according to claim 15, wherein the second display sub-area comprises first sub-pixels, second sub-pixels and third sub-pixels;

in the second display sub-area, a center of a first sub-pixel, a center of a second sub-pixel and a center of a third sub-pixel are connected to form an isosceles triangle, wherein the first sub-pixel, the second sub-pixel and the third sub-pixel are adjacent to each other.

17. A display device, comprising the display substrate according to claim 15.

18. A display substrate, comprising a display area comprising a first display sub-area and a second display sub-area, wherein:

a distribution density of pixels in the first display sub-area is greater than a distribution density of pixels in the second display sub-area;

the first display sub-area comprises a plurality of first pixel elements and a plurality of second pixel elements;

the second display sub-area comprises a plurality of third pixel elements, wherein each of the plurality of third pixel elements comprises multiple sub-pixels, and a distance between any two adjacent sub-pixels in the each third pixel element is less than a distance between any two adjacent third pixel elements; and the first display sub-area is a normal display area, the second display sub-area is an under-screen camera display area with a camera, and a light-emitting area of a sub-pixel in the under-screen camera display area is greater than a light-emitting area of a sub-pixel, with a same light-emitting color as the sub-pixel in the under-screen camera display area, in the normal display area;

wherein the each third pixel element comprises a first sub-pixel, a second sub-pixel and a third sub-pixel; and second sub-pixels of third pixel elements on a same column are arranged on a straight line, a distance between any two adjacent second sub-pixels in the same column is the same, a distance between any two adjacent second sub-pixels in a same row is the same, a size of the second sub-pixel is less than a size of the third sub-pixel, and the first sub-pixel, the second sub-pixel and the third sub-pixel all have edges parallel to a column direction or a row direction;

wherein in the second display sub-area, two adjacent columns of third pixel elements are misaligned, two adjacent rows of third pixel elements are misaligned, and first sub-pixels, second sub-pixels and third sub-pixels in two third pixel elements adjacent in the column direction are arranged in a same order and in a same arrangement;

wherein first sub-pixels in one row of sub-pixels at an edge of the first display sub-area close to the second display sub-area correspond to third sub-pixels in one row of sub-pixels at an edge of the second display sub-area close to the first display sub-area, and closest distances between the first sub-pixels in the row of sub-pixels at the edge of the first display sub-area and the third sub-pixels in the row of sub-pixels at the edge of the second display sub-area are the same.

19. The display substrate according to claim 18, wherein, a sub-pixel is located in the one row of sub-pixels at the edge of the first display sub-area close to the second display sub-area, an another sub-pixel is located in the one row of sub-pixels at the edge of the second display sub-area close to the first display sub-area, the sub-pixel is adjacent to the another sub-pixel, and a distance between the sub-pixel and the another sub-pixel is less than a length of the third sub-pixel of the third pixel element in the column direction; and/or a sub-pixel is located in one column of sub-pixels at an edge of the first display sub-area close to the second display sub-area, an another sub-pixel is located in one column of sub-pixels at an edge of the second display sub-area close to the first display sub-area, the sub-pixel is adjacent to the another sub-pixel, and a distance between the sub-pixel and the another sub-pixel is less than a length of the third sub-pixel of the third pixel element in the row direction.

* * * * *